(12) United States Patent
Tak

(10) Patent No.: US 12,068,039 B2
(45) Date of Patent: Aug. 20, 2024

(54) MEMORY DEVICE AND METHOD OF OPERATING THE SAME

(71) Applicant: SK hynix Inc., Icheon-si Gyeonggi-do (KR)

(72) Inventor: Jae Il Tak, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 75 days.

(21) Appl. No.: 17/892,600

(22) Filed: Aug. 22, 2022

(65) Prior Publication Data

US 2023/0307063 A1 Sep. 28, 2023

(30) Foreign Application Priority Data

Mar. 23, 2022 (KR) .................. 10-2022-0036321

(51) Int. Cl.
*G11C 11/56* (2006.01)
*G11C 16/26* (2006.01)

(52) U.S. Cl.
CPC .......... *G11C 16/26* (2013.01); *G11C 11/5642* (2013.01); *G11C 11/5671* (2013.01)

(58) Field of Classification Search
CPC . G11C 16/26; G11C 11/5642; G11C 11/5671; G11C 16/30; G11C 16/08; G11C 16/0483
See application file for complete search history.

(56) References Cited

U.S. PATENT DOCUMENTS

| 8,625,367 | B2 * | 1/2014 | Yun ........................ G11C 8/08 |
| | | | 365/185.23 |
| 9,159,435 | B2 * | 10/2015 | Yang ..................... G11C 16/26 |
| 2005/0254302 | A1 * | 11/2005 | Noguchi ............ G11C 16/0483 |
| | | | 365/185.17 |
| 2008/0049494 | A1 * | 2/2008 | Aritome ............. G11C 16/3418 |
| | | | 365/185.02 |
| 2010/0165741 | A1 * | 7/2010 | Han .................... G11C 16/0483 |
| | | | 365/185.18 |
| 2013/0077404 | A1 * | 3/2013 | Nawata .............. G11C 16/3454 |
| | | | 365/185.17 |
| 2019/0096495 | A1 * | 3/2019 | Shim ....................... G11C 5/06 |
| 2019/0348122 | A1 * | 11/2019 | Ko ...................... G11C 11/5642 |

FOREIGN PATENT DOCUMENTS

| KR | 1020170006207 A | 1/2017 |
| KR | 1020190130263 A | 11/2019 |

* cited by examiner

*Primary Examiner* — Khamdan N. Alrobaie
(74) *Attorney, Agent, or Firm* — WILLIAM PARK & ASSOCIATES LTD.

(57) ABSTRACT

Provided herein may be a memory device and a method of operating the same. The memory device may include a memory block including a plurality of memory cells that are coupled to a plurality of word lines, a peripheral circuit configured to perform a read operation by applying a read voltage to a selected word line, among the plurality of word lines, and applying a first pass voltage to target word lines, wherein the target word lines are adjacent to the selected word line, among unselected word lines other than the selected word line, and a control logic configured to decrease the read voltage based on a read voltage variation and to decrease the first pass voltage based on a pass voltage variation when the read voltage decreases, wherein the pass voltage variation is less than the read voltage variation.

20 Claims, 18 Drawing Sheets

FIG. 7

| | variance | | |
|---|---|---|---|
| | t1 | t2 | t3 |
| VR | dr1 | dr2 | dr3 |
| VRpass1 | dp1 (≤dr1) | dp2 (≤dr2) | dp3 (≤dr3) |

FIG. 8A

| | variance | | |
|---|---|---|---|
| | t1 | t2 | t3 |
| VR | dr1 | dr2 | dr3 |
| VRpass1 | dp1 (=dr1 x w1) (0<w1<1) | dp2 (=dr2 x w2) (0<w2<1) | dp3 (=dr3 x w3) (0<w3<1) |

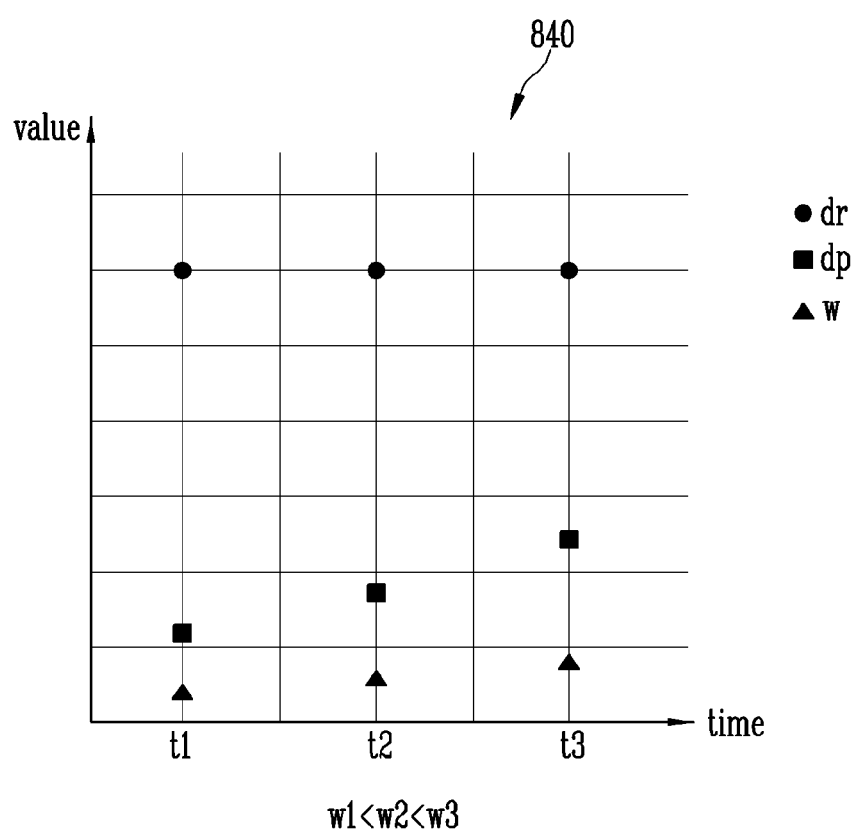

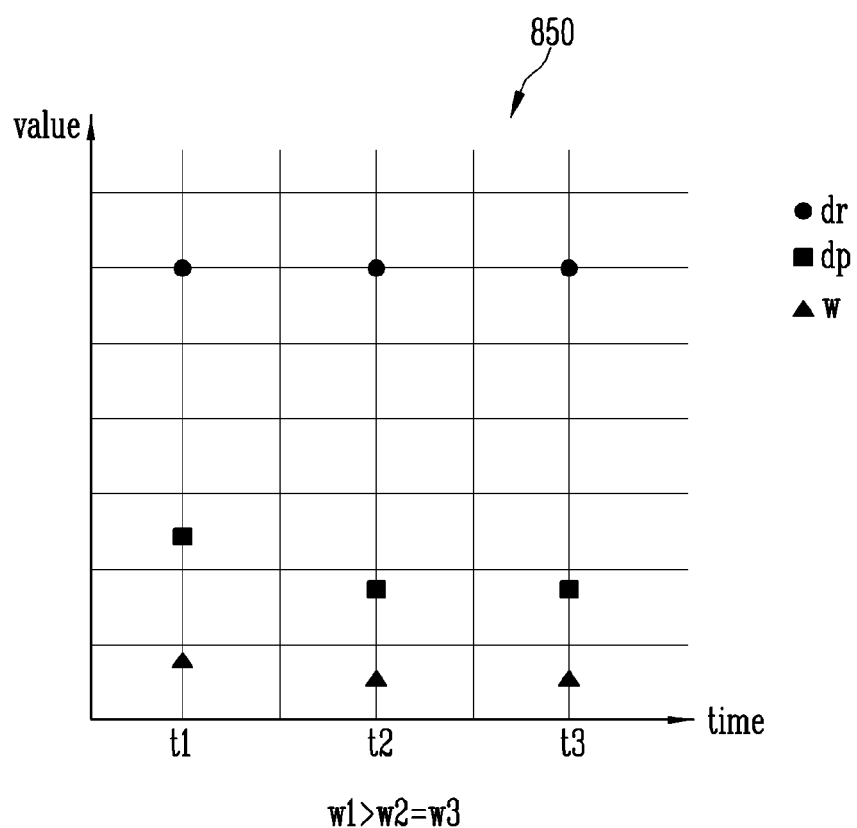

MEMORY DEVICE AND METHOD OF OPERATING THE SAME

CROSS-REFERENCE TO RELATED APPLICATION

The present application claims priority under 35 U.S.C. § 119(a) to Korean patent application number 10-2022-0036321, filed on Mar. 23, 2022, in the Korean Intellectual Property Office, the entire disclosure of which is incorporated herein by reference.

BACKGROUND

1. Technical Field

Various embodiments of the present disclosure generally relate to an electronic device, and more particularly to a memory device and a method of operating the memory device.

2. Related Art

A storage device is a device which stores data under the control of a host device, such as a computer or a smartphone. The storage device may include a memory device in which data is stored and a memory controller that controls the memory device. Memory devices are classified into a volatile memory device and a nonvolatile memory device.

The volatile memory device is a memory device in which data is stored only when power is supplied and in which stored data is lost when the supply of power is interrupted. Examples of the volatile memory device may include a static random access memory (SRAM) and a dynamic random access memory (DRAM).

The nonvolatile memory device is be a memory device in which stored data is retained even when the supply of power is interrupted. Examples of the nonvolatile memory device may include a read only memory (ROM), a programmable ROM (PROM), an electrically programmable ROM (EPROM), an electrically erasable and programmable ROM (EEPROM), and a flash memory.

A read operation is an operation of reading data that is stored in a memory device. In detail, the read operation may be an operation to apply a read voltage to a selected word line and apply a pass voltage to unselected word lines. In order to reduce the time that is required for a read operation, technology for accurately and rapidly controlling the levels of the voltages to be applied to word lines is required.

SUMMARY

An embodiment of the present disclosure may provide for a memory device. The memory device may include a memory block including a plurality of memory cells that are coupled to a plurality of word lines, a peripheral circuit configured to perform a read operation by applying a read voltage to a selected word line, among the plurality of word lines, and applying a first pass voltage to target word lines, wherein the target word lines are adjacent to the selected word line, among unselected word lines other than the selected word line, and a control logic configured to decrease the read voltage based on a read voltage variation and to decrease the first pass voltage based on a pass voltage variation when the read voltage decreases, wherein the pass voltage variation is less than the read voltage variation.

An embodiment of the present disclosure may provide for a method of operating a memory device. The method may include applying a read voltage to a selected word line, among a plurality of word lines, coupled to a memory block that is included in the memory device, and applying pass voltages to unselected word lines, decreasing the read voltage based on a first voltage variation, and decreasing a pass voltage that is applied to target word lines, among the unselected word lines, adjacent to the selected word line, based on a second voltage variation when the read voltage decreases, wherein the second voltage variation is less than the first voltage variation.

BRIEF DESCRIPTION OF THE DRAWINGS

FIG. 7 is a diagram illustrating a voltage variation according to an embodiment.

FIGS. 8A to 8E are diagrams illustrating a voltage variation according to an embodiment.

DETAILED DESCRIPTION

Specific structural or functional descriptions in the embodiments of the present disclosure introduced in this specification or application are exemplified to describe embodiments according to the concept of the present disclosure. The embodiments according to the concept of the present disclosure may be practiced in various forms, and should not be construed as being limited to the embodiments described in the specification or application.

Various embodiments of the present disclosure are directed to a memory device that is capable of reducing the time required for a read operation, and a method of operating the memory device.

Figure 1:
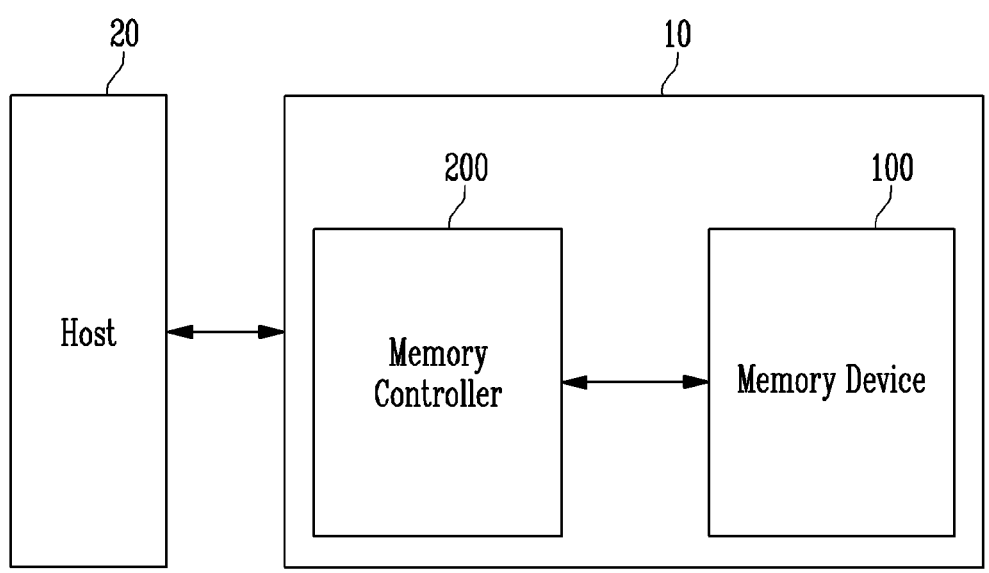
FIG. 1 is a diagram illustrating a memory system according to an embodiment.

FIG. 1 is a diagram illustrating a memory system according to an embodiment.

Referring to FIG. 1, a memory system 10 may be operated in response to a request from a host 20. In detail, the memory system 10 may perform an operation that corresponds to a request that is received from the host 20. In an example, when data and a data storage request are received from the host 20, the memory system 10 may store the data therein. In other examples, when a data read request is received from the host 20, the memory system 10 may provide the data that is stored therein to the host 20. For this, the memory system 10 may be coupled to the host 20 though various communication schemes.

The memory system 10 may be implemented as any one of various types of storage devices based on a communication standard or a data storage method. For example, the memory system 10 may be implemented as any one of a solid state drive (SSD), a multimedia card (MMC), an embedded MMC (eMMC), reduced-size MMC (RS-MMC), a micro-MMC-type storage device, secure digital (SD) card, mini-SD card, or micro-SD-type storage device, a universal serial bus (USB) storage device, a universal flash storage (UFS) device, a personal computer memory card international association (PCMCIA)-type storage device, a peripheral component interconnection (PCI)-type storage device, a PCI express (PCI-E)-type storage device, a network attached storage (NAS), and a wireless network storage device. Here, enumerated examples are only embodiments, and the memory system 10 may be implemented as various types of storage devices without being limited to the embodiments.

The host 20 may be one of various electronic devices, such as a desktop computer, a laptop computer, a smartphone, a game console, a television (TV), a tablet computer, a set-top box, a washing machine, a robot, a refrigerator, an artificial intelligence speaker, a wearable device, a central processing unit (CPU), an accelerated processing unit (APU), a graphic processor unit (GPU), and a neural processing unit (NPU). The host 20 may transmit data, a logical address, or various requests to the memory system 10 or may receive data from the memory system 10.

The memory system 10 may be used as a main memory device or an auxiliary memory device of the host 20. The memory system 10 may be located inside or outside of the host 20.

The memory system 10 may include a memory device 100 and a memory controller 200. Here, the number of memory devices 100 may be one or more. The memory device 100 and the memory controller 200 may be coupled to each other through channels. The memory device 100 and the memory controller 200 may transmit/receive a command, an address, or data through the channels.

The memory device 100 may store data. For example, the memory device 100 may be implemented as any of various types of semiconductor memory devices. In an example, the memory device 100 may be implemented as one of a NAND flash memory device, a vertical NAND flash memory device, a NOR flash memory device, a static random access memory (static RAM; SRAM) device, a dynamic RAM (DRAM) device, a synchronous dynamic RAM (SDRAM) device, a double data rate (DDR) SDRAM device, a low power DDR (LPDDR) SDRAM device, a graphics DRAM (GDRAM) device, a Rambus DRAM (RDRAM) device, a ferro-electric RAM (FeRAM) device, a magnetoresistive RAM (MRAM) device, a phase-change memory (PCM) device, a spin transfer torque magnetoresistive RAM (STT-MRAM) device, and a resistive RAM (ReRAM) device. Hereinafter, for convenience of description, a description is made on the assumption that the memory device 100 is a NAND flash memory device.

The memory device 100 may include at least one memory block. Each memory block may include a plurality of pages. One page may include a plurality of memory cells. That is, each memory block may include a plurality of memory cells. Here, each memory cell may be a minimum unit in which data is stored. In an embodiment, the memory cell may be implemented by using a transistor including a control gate, an insulating layer, and a floating gate. For example, when a program voltage is applied to the control gate of the memory cell, electrons may be stored in the floating gate of the memory cell through a tunneling phenomenon. In this case, the threshold voltage of the memory cell may be changed based on the number of electrons that are stored in the floating gate. The threshold voltage of the memory cell may belong to any one of a plurality of program states having different voltage ranges. The program state of the memory cell may indicate the value of data that is stored in the memory cell.

The memory controller 200 may control the overall operation of the memory device 100. For example, the memory controller 200 may control the memory device 100 so that the memory device 100 performs a program operation of storing data, a read operation of requesting stored data, or an erase operation of erasing the stored data.

In an embodiment, the memory controller 200 may control the memory device 100 so that the memory device 100 performs a program operation, a read operation, or an erase operation in response to a request that is received from the host 20. For example, when a data storage request, a data read request, or a data erase request is received from the host 20, the memory controller 200 may generate a command that corresponds to the data storage request, read request, or erase request. Further, when a logical address is received from the host 20, the memory controller 200 may translate the logical address into a physical address. Here, the physical address may be a unique identifier indicating a memory block or a page that is included in the memory device 100. The memory controller 200 may transmit the physical address, together with the command, to the memory device 100.

In an embodiment, in the case of a program operation, the memory controller 200 may provide a program command, an address, and data to the memory device 100. Here, the address may be a physical address. When the program command, the address, and the data are received from the memory controller 200, the memory device 100 may perform a program operation of storing page data in a page that is selected by the address.

In an embodiment, in the case of a read operation, the memory controller 200 may provide a read command and an address to the memory device 100. When the read command and the address are received from the memory controller 200, the memory device 100 may perform a read operation of providing page data, stored in a page that is selected by the address, to the memory controller 200.

In an embodiment, in the case of an erase operation, the memory controller 200 may provide an erase command and an address to the memory device 100. When the erase command and the address are received from the memory controller 200, the memory device 100 may perform an erase operation of deleting pieces of page data, stored in a memory block, selected by the address.

In other embodiments, the memory controller 200 may control the memory device 100 to internally perform a program operation, a read operation, or an erase operation regardless of a request that is received from the host 20. For example, the memory controller 200 may control the memory device 100 to perform wear leveling, read reclaim, or garbage collection. For this, the memory controller 200 may internally generate a command, an address, and data and may transmit the command, address, and data to the memory device 100.

The memory device 100 may store data based on various types of data storage schemes. For example, the data storage schemes may include a single-level cell (SLC) scheme, a multi-level cell (MLC) scheme, a triple-level cell (TLC) scheme, a quad-level cell (QLC) scheme, etc. The SLC scheme may be a scheme for storing 1 bit in one memory cell. The MLC scheme may be a scheme for storing 2 bits in one memory cell. The TLC scheme may be a scheme for storing 3 bits in one memory cell. The QLC scheme may be a scheme for storing 4 bits in one memory cell.

In the case of the SLC scheme, one memory cell may have one of two program states based on the threshold voltage of the memory cell. Here, each of the two program states may indicate one of two binary values, such as '1' and '0'. That is, one memory cell may store one of two binary values. In this case, the number of levels of a read voltage that is required in order to distinguish two program states from each other may be 1.

In the case of the MLC scheme, one memory cell may have one of four program states based on the threshold voltage of the memory cell. Here, each of the four program states may indicate one of four binary values, such as '11', '10', '01', and '00.' That is, one memory cell may store one of four binary values. In this case, the number of levels of a read voltage that is required in order to distinguish four program states from each other may be 3.

Similarly, in the case of the TLC scheme, one memory cell may have one of eight program states based on the threshold voltage of the memory cell, and each of the eight program states may correspond to one of eight binary values, such as '111' to '000'. In this case, the number of levels of a read voltage that is required in order to distinguish eight program states from each other may be 7. In the case of the QLC scheme, one memory cell may have one of 16 program states based on the threshold voltage of the memory cell, and each of the 16 program states may correspond to one of 16 binary values, such as '1111' to '0000'. In this case, the number of levels of a read voltage that is required in order to distinguish 16 program states from each other may be 15.

The memory device 100 may perform a read operation of reading data that is stored in a memory cell. The read operation may be an operation to apply a read voltage to a selected word line and apply a pass voltage to unselected word lines. The pass voltage may be a voltage for turning on channels of unselected memory cells during a read operation.

The memory device 100 may perform a read operation based on an under-drive scheme. The under-drive scheme may be a method of decreasing the level of the read voltage in a stepwise manner during a read operation. For example, the under-drive scheme may be a scheme for decreasing the read voltage in a stepwise manner so that the level of the read voltage changes from the highest level to the second highest level, among a plurality of preset levels. Here, the memory cell that is read based on the under-drive scheme may be a memory cell that stores data by using a scheme, such as an MLC scheme, a TLC scheme, or a QLC scheme.

When the read voltage decreases, the memory device 100 may decrease the pass voltage that is applied to target word lines that are directly adjacent to a selected word line, together with the read voltage. That is, the memory device 100 may decrease the pass voltage that is applied to the target word line, together with the read voltage, in synchronization with a time point at which the read voltage decreases. Here, a pass voltage variation (variance) in the pass voltage may be less than a read voltage variation (variance) in the read voltage. In accordance with the above-described embodiments of the present disclosure, the memory device 100 may reduce the time that is required for the read operation. Hereinafter, embodiments of the present disclosure will be described in detail with reference to the attached drawings.

Figure 2:
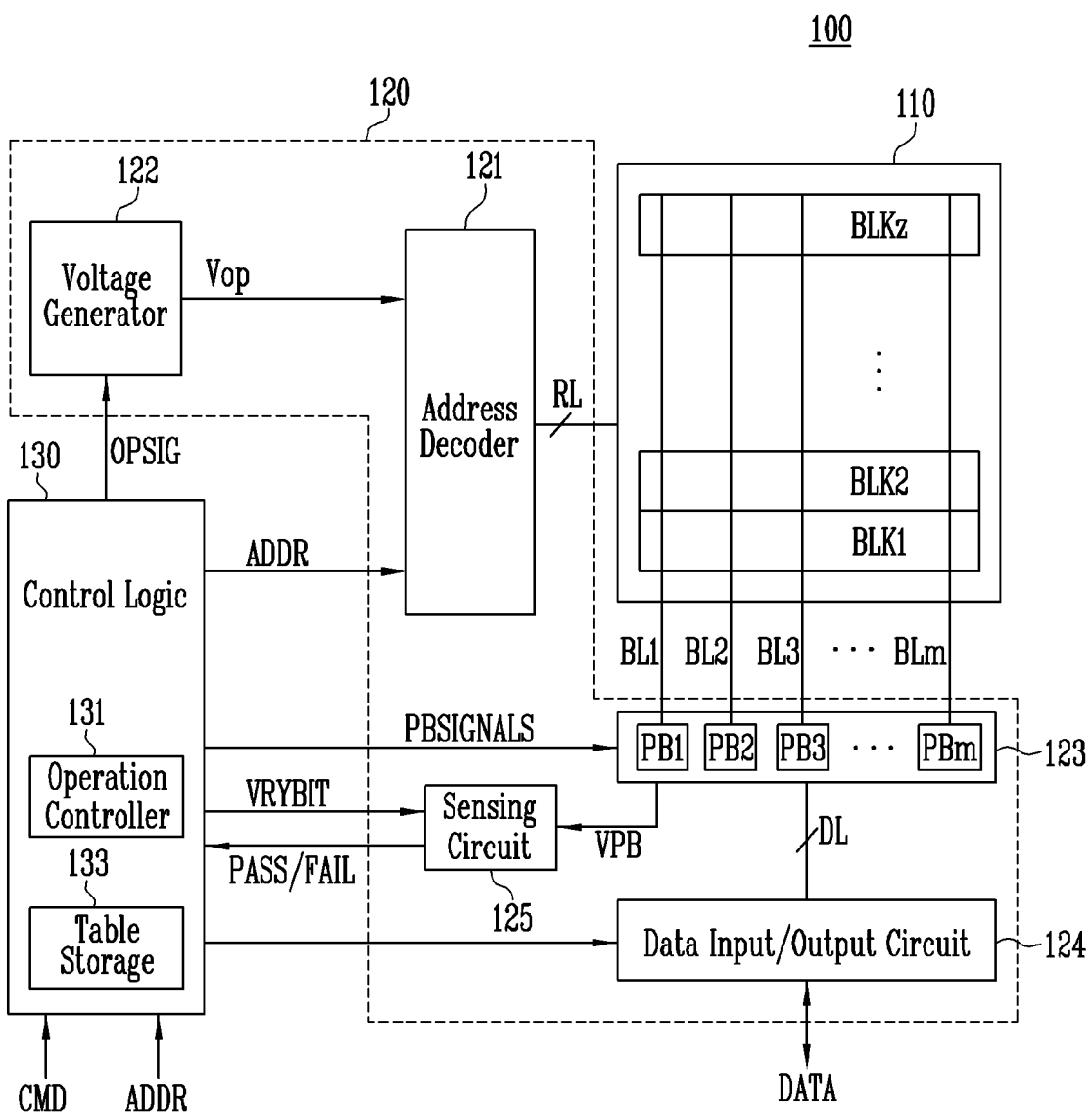
FIG. 2 is a diagram illustrating the structure of a memory device according to an embodiment.

FIG. 2 is a diagram illustrating the structure of a memory device according to an embodiment.

Referring to FIG. 2, the memory device 100 may include a memory cell array 110, a peripheral circuit 120, and a control logic 130.

The memory cell array 110 may include a plurality of memory blocks BLK1 to BLKz. Individual memory blocks may be configured to have the same structure. Hereinafter, for convenience of description, any one memory block BLKz, among the plurality of memory blocks BLK1 to BLKz, will be described in detail.

The memory block BLKz may include a plurality of pages. Each page may include memory cells. That is, the memory block BLKz may include a plurality of memory cells. The plurality of memory cells may be arranged on a two-dimensional (2D) plane or in a three-dimensional (3D) vertical structure. Here, each memory cell may be a semiconductor memory element. In an embodiment, each memory cell may be a nonvolatile memory element.

The memory block BLKz may be coupled to the address decoder 121 of the peripheral circuit 120 through row lines RL. Here, the row lines RL may include a plurality of word lines. That is, the memory block BLKz may be coupled to the plurality of word lines. Here, one page in the memory block BLKz may be coupled to one word line. That is, memory cells that are included in one page may be coupled in common to one word line. Meanwhile, each of pages that are included in the memory block BLKz may be coupled to bit lines BL1 to BLm. The bit lines BL1 to BLm may be respectively coupled to page buffers PB1 to PBm of the peripheral circuit 120. The detailed structure of the memory block BLKz will be described later with reference to FIG. 3.

The peripheral circuit 120 may be operated under the control of the control logic 130. The peripheral circuit 120 may perform a program operation, a read operation, or an erase operation.

The peripheral circuit 120 may include the address decoder 121, a voltage generator 122, a read and write circuit 123, a data input/output circuit 124, and a sensing circuit 125.

The address decoder 121 may be coupled to the memory cell array 110 through the row lines RL. For example, referring to FIGS. 2 and 3, the row lines RL may include a drain select line DSL, a plurality of word lines WL1 to WL16, a source select line SSL, and a source line SL. In an embodiment, the address decoder 121 may include components, such as a row decoder, a column decoder, and an address buffer.

The address decoder 121 may be operated under the control of the control logic 130. In an example, the address decoder 121 may receive an address ADDR from the control logic 130. The address decoder 121 may decode a block address and a page address that is included in the received address ADDR. Here, the block address may indicate a specific memory block. The page address may indicate a specific page or a specific word line. That is, a specific memory block may be selected according to the block address, and a specific page or a specific word line may be selected according to the page address. The address decoder 121 may apply an operating voltage Vop to a selected memory block or a selected page in the selected memory block. The operating voltage Vop may be supplied from the voltage generator 122.

The voltage generator 122 may generate various types of operating voltages Vop by using external power that is supplied to the memory device 100. Here, the external power may be reserve (standby) power that is included in the memory system 10 or power of the host 20. The operating voltages Vop may include one of a voltage that is used for a program operation, a voltage that is used for a read operation, and a voltage that is used for an erase operation. The voltage that is used for the program operation may include a program voltage, a program pass voltage, a verify voltage, and a verify pass voltage. The voltage that is used for the read operation may include a read voltage, a first pass voltage, and a second pass voltage. The voltage that is used for the erase operation may include first and second erase voltages. The voltage generator 122 may be operated under the control of the control logic 130. For example, when an operation signal OPSIG is received from the control logic 130, the voltage generator 122 may transfer an operating voltage Vop that corresponds to the operation signal OPSIG to the address decoder 121.

The read and write circuit 123 may include a plurality of page buffers PB1 to PBm. Each of the plurality of page buffers PB1 to PBm may be coupled to the memory cell array 110 through a corresponding one of the plurality of bit lines BL1 to BLm. For example, the first page buffer PB1 may be coupled in common to memory cells, among memory cells that are included in each of the plurality of memory blocks BLK1 to BLKz, indicating a first column, through the first bit line BL1. Each of the plurality of page buffers PB1 to PBm may temporarily store data DATA. For this, each of the plurality of page buffers PB1 to PBm may be implemented by using various memory elements, such as latch circuits.

The read and write circuit 123 may be operated under the control of the control logic 130. In an embodiment, the read and write circuit 123 may perform operations that correspond to buffer control signals PBSIGNALS that are received from the control logic 130. For example, in response to the buffer control signals PBSIGNALS, the read and write circuit 123 may apply a voltage that corresponds to the data DATA to each of the plurality of bit lines BL1 to BLm or may sense the voltage of each of the plurality of bit lines BL1 to BLm and then read the data DATA. In this way, the data DATA, temporarily stored in the plurality of page buffers PB1 to PBm, may be stored in a specific region of the memory cell array 110, or alternatively, the data DATA, stored in the specific region of the memory cell array 110, may be read and temporarily stored in the plurality of page buffers PB1 to PBm. Here, the specific region may be a page that is indicated by a page address.

The data input/output circuit 124 may be coupled to the read and write circuit 123 through data lines DL. The data input/output circuit 124 may include a plurality of input/output buffers that receive the input data DATA. The data input/output circuit 124 may be operated in response to a control signal that is output from the control logic 130. For example, when the control signal is received from the control logic 130, the data input/output circuit 124 may output data DATA, temporarily stored therein, to the read and write circuit 123 through the data lines DL or may output the data DATA, temporarily stored therein, to the memory controller 200 through channels.

The sensing circuit 125 may generate a reference voltage in response to an enable bit signal VRYBIT that is received from the control logic 130. The sensing circuit 125 may output a pass signal PASS or a fail signal FAIL to the control logic 130 based on the result of comparing a sensing voltage VPB that is received from the read and write circuit 123 with the reference voltage. Here, the pass signal PASS may indicate success in a program pulse operation or a read operation. The fail signal FAIL may indicate failure in a program pulse operation or in a read operation.

The control logic 130 may control the overall operation of the memory device 100. The control logic 130 may control the peripheral circuit 120 to perform a program operation, a read operation, or an erase operation in response to a command CMD and an address ADDR, which are received from the memory controller 200. Here, the command CMD may be a program command, a read command, or an erase command. For this, the control logic 130 may be coupled to the peripheral circuit 120. For example, the control logic 130 may be coupled to the address decoder 121, the voltage generator 122, the read and write circuit 123, the data input/output circuit 124, and the sensing circuit 125.

In an embodiment, when the program command and the address ADDR are received from the memory controller 200, the control logic 130 may control the peripheral circuit 120 to perform a program operation of storing data DATA in a selected page that corresponds to the address ADDR. Here, the data DATA may include data that corresponds to one or more pages. In an example, in the case of the TLC scheme, the data DATA may include least significant bit (LSB) page data, central significant bit (CSB) page data, and most significant bit (MSB) page data. In an example, in the case of the MLC scheme, the data DATA may include LSB page data and MSB page data.

In an embodiment, the control logic 130 may control the peripheral circuit 120 to perform a program operation based on an incremental step pulse programming (ISPP) scheme. For example, the program operation based on the ISPP scheme may include a plurality of program loops. Each program loop may include a program pulse operation and a program verify operation that are sequentially performed. The program pulse operation may be an operation to apply a program voltage to a selected page to change a threshold voltage. The program verify operation may be an operation to apply a verify voltage to the selected page to verify whether the program pulse operation has succeeded or failed. When the result of the verify operation indicates success in the program pulse operation, the control logic 130 may terminate the program operation. When the result of the verify operation indicates failure in the program pulse operation, the control logic 130 may control the peripheral circuit 120 to perform a subsequent program loop in which the level of the program voltage is increased.

In an embodiment, when the read command and the address ADDR are received from the memory controller 200, the control logic 130 may control the peripheral circuit 120 to perform a read operation that reads data DATA that is stored in a selected page that corresponds to the address ADDR. Furthermore, the control logic 130 may control the peripheral circuit 120 to transmit the data DATA that is read from the selected page to the memory controller 200.

For example, when the read command and the address ADDR are received from the memory controller 200, the control logic 130 may control the peripheral circuit 120 to apply a read voltage to a selected page in the memory block BLKz that corresponds to the address ADDR and to apply a pass voltage to unselected pages in the memory block BLKz. Further, the control logic 130 may control the peripheral circuit 120 to transmit the read page data to the memory controller 200.

Meanwhile, some of the memory blocks BLK1 to BLKz may be system memory blocks or content addressable memory (CAM) blocks. The system memory blocks or the CAM blocks may store information that is related to the operation of the memory device 100. For example, the information related to the operation of the memory device 100 may include the default level of the program voltage, the default level of the read voltage, information about bad blocks, the number of fail bits, etc.

The control logic 130 may apply voltages in a stepwise manner to a selected word line and to unselected word lines during a read operation. In detail, the control logic 130 may decrease the read voltage based on the read voltage variation during the read operation. Also, the control logic 130 may decrease a first pass voltage based on the pass voltage variation when the read voltage decreases. Here, the pass voltage variation may be less than the read voltage variation. The read voltage may be a voltage that is applied to a selected word line, and the first pass voltage may be a voltage that is applied to target word lines that are directly adjacent to the selected word line, among unselected word lines.

The control logic 130 may maintain a second pass voltage when the read voltage decreases. Here, the second pass voltage may be a voltage that is applied to the word lines other than the target word lines, among the unselected word lines.

In an embodiment, the control logic 130 may include an operation controller 131 and a table storage 133.

The operation controller 131 may control the peripheral circuit 120 to perform a read operation. In detail, the operation controller 131 may control the peripheral circuit 120 to perform a read operation that applies the read voltage to the selected word line, among the plurality of word lines, and applies the first pass voltage to target word lines, among the unselected word lines, directly adjacent to the selected word line. Here, the plurality of word lines may be coupled to one memory block BLKz. The selected word line may be a word line that is selected by the address ADDR from among the plurality of word lines. The unselected word lines may be word lines that are not selected by the address ADDR from among the plurality of word lines.

The table storage 133 may store voltage information including the values of the read voltage variation and the values of the pass voltage variation, respectively corresponding to a plurality of reference times. For example, the voltage information may include information such as the first value of the read voltage variation that corresponds to a first reference time, the first value of the pass voltage variation that corresponds to the first reference time, the second value of the read voltage variation that corresponds to a second reference time, and the second value of the pass voltage variation that corresponds to the second reference time. Here, each reference time may be a preset time, time point, or time period.

In an embodiment, the operation controller 131 may control the timing at which the read voltage and the pass voltages are to be applied. The operation controller 131 may control the level of the read voltage and the level of each pass voltage.

The operation controller 131 may decrease the read voltage based on the read voltage variation and may decrease the first pass voltage based on the pass voltage variation, the pass voltage variation being less than the read voltage variation, when the read voltage decreases. That is, the operation controller 131 may control the peripheral circuit 120 to decrease the read voltage and the first pass voltage at the same time point. In an embodiment, the operation controller 131 may control the peripheral circuit 120 to decrease the first pass voltage whenever the read voltage decreases.

In an embodiment, the operation controller 131 may sense the states of selected memory cells that are coupled to the selected word line by applying the read voltage having a first voltage level to the selected word line. In detail, the operation controller 131 may control the peripheral circuit 120 to apply the read voltage having a first voltage level to the selected word line, the first pass voltage to the target word lines, among the unselected word lines, and the second pass voltage to the rest of the unselected word lines. Also, the operation controller 131 may receive, from the peripheral circuit 120, the results of sensing the states of the selected memory cells, among the plurality of memory cells, coupled to the selected word line, based on the first voltage level. The sensed results may include information about memory cells having threshold voltages that are equal to or greater than the first voltage level or memory cells having threshold voltages that are less than the first voltage level, among the selected memory cells that are coupled to the selected word line. Here, the first voltage level may correspond to a program state.

After the states of the selected memory cells are sensed, the operation controller 131 may decrease the read voltage from the first voltage level to the second voltage level based on the read voltage variation. The operation controller 131 may decrease the first pass voltage based on the pass voltage variation when the read voltage decreases. Here, the first voltage level may be a voltage level that is higher than the second voltage level. The operation controller 131 may control the peripheral circuit 120 to maintain the second pass voltage when the read voltage decreases. Furthermore, the operation controller 131 may sense the states of the selected memory cells that are coupled to the selected word line based on the second voltage level.

Figure 3:
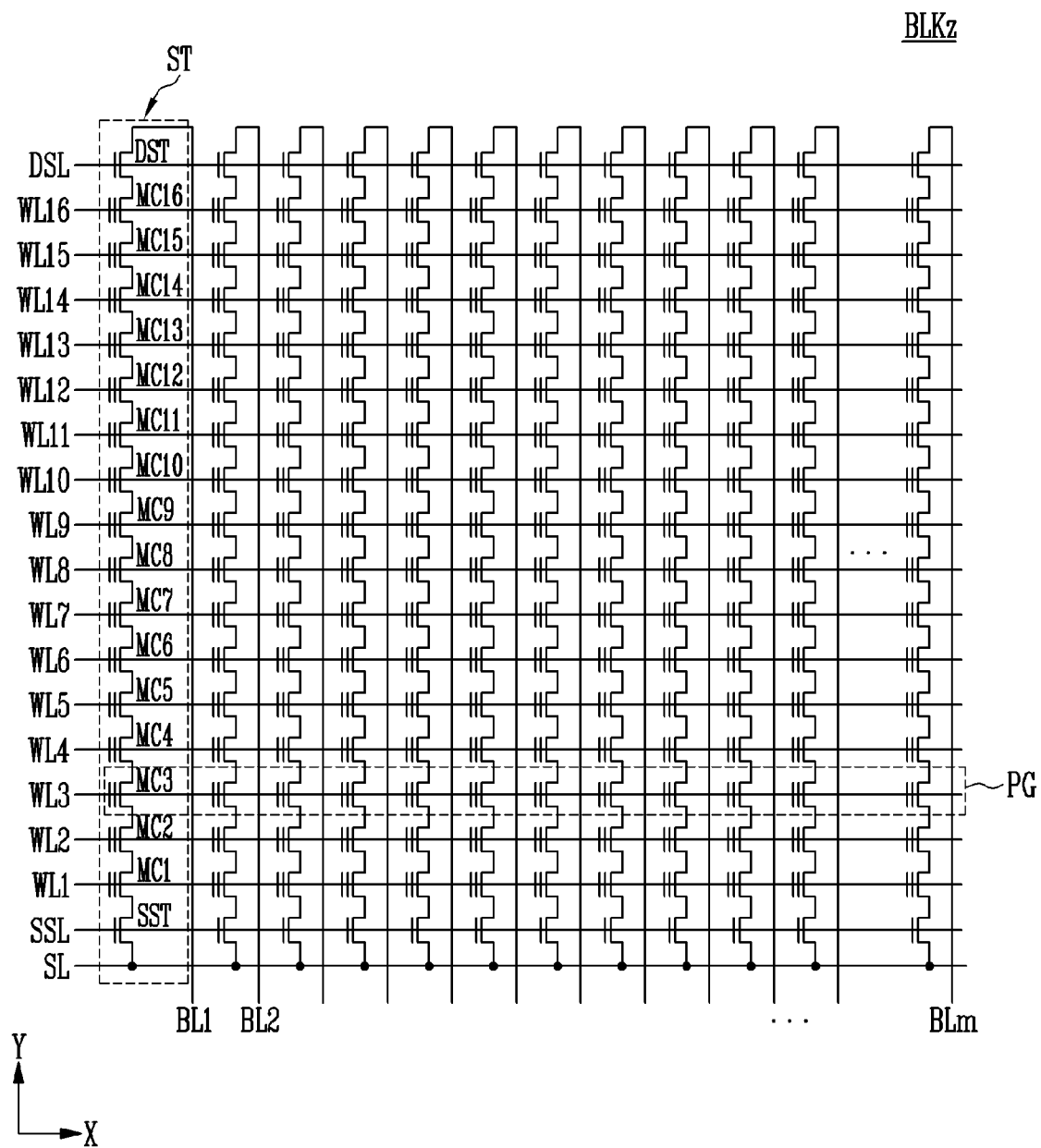
FIG. 3 is a diagram illustrating the structure of a memory block according to an embodiment.

FIG. 3 is a diagram illustrating the structure of a memory block according to an embodiment.

Referring to FIG. 3, a memory block BLKz may include a plurality of memory cells MC1 to MC16 that are coupled to a plurality of word lines WL1 to WL16. The memory block BLKz may include a plurality of strings. Since the plurality of strings may be equally configured, a string ST that is coupled to a first bit line BL1 will be described by way of example.

A first end of the string ST may be coupled to any one of a plurality of bit lines BL1 to BLm. For example, the first end of the string ST may be coupled to the first bit line BL1. A second end of the string ST may be coupled to a source line SL. Here, one source line SL may be coupled in common to the plurality of strings, and one bit line may be coupled to one string.

The string ST may include a source select transistor SST, a plurality of memory cells MC1 to MC16, and a drain select transistor DST, which are coupled in series to each other between the source line SL and the first bit line BL1. In an embodiment, the string ST may include at least one source select transistor SST and at least one drain select transistor DST and may also include more memory cells than the memory cells MC1 to MC16 illustrated in the drawing.

A gate of the source select transistor SST may be coupled to a source select line SSL, and a gate of the drain select transistor DST may be coupled to a drain select line DSL. A source of the source select transistor SST may be coupled to the source line SL, and a drain of the drain select transistor DST may be coupled to the first bit line BL1.

Gates of the plurality of memory cells MC1 to MC16 may be respectively coupled to the plurality of word lines WL1 to WL16 in one-to-one correspondence. The memory cells MC1 to MC16 may be coupled in series to and disposed between the source select transistor SST and the drain select transistor DST.

The memory block BLKz may include a plurality of pages. One page PG may be defined as a group of memory cells that are coupled in common to the same word line. Here, the page PG may be a set of memory cells that correspond to a unit on which a program operation or a read operation is performed. The memory block BLKz may be a set of memory cells that correspond to a unit on which an erase operation is performed.

The page PG may store page data. The number of pieces of page data may be determined according to the number of bits in data that is stored in each memory cell. In an example, in the case of an SLC scheme, one piece of page data may be stored in one page PG. In an example, in the case of an MLC scheme, two pieces of page data may be stored in one page PG. In an example, in the case of a TLC scheme, three pieces of page data may be stored in one page PG.

Figure 4A:
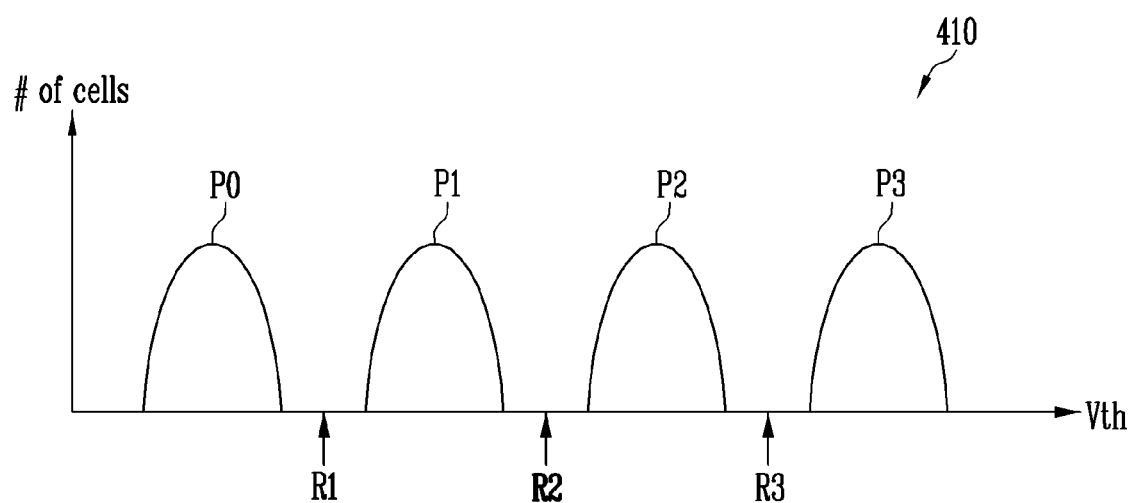
FIGS. 4A and 4B are diagrams illustrating threshold voltage distributions of memory cells according to an embodiment of the present disclosure.
Figure 4B:
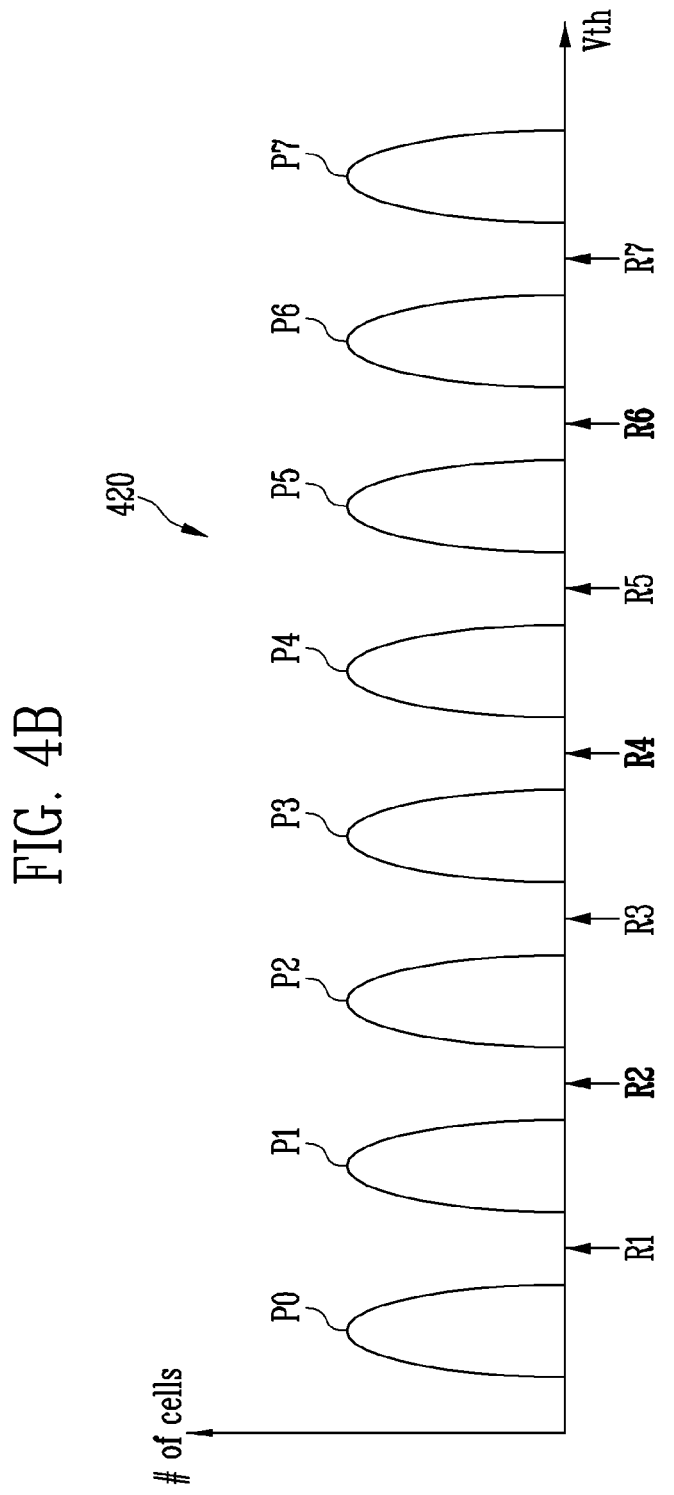

FIGS. 4A and 4B are diagrams illustrating threshold voltage distributions of memory cells according to an embodiment of the present disclosure.

Referring to FIG. 4A, each of memory cells that are programmed through an MLC scheme may have a threshold voltage that corresponds to a first threshold voltage distribution 410. In this case, each memory cell may have one program state, among a plurality of program states P0 to P3, corresponding to the threshold voltage thereof. The plurality of program states P0 to P3 may include a 0-th program state P0 to a third program state P3. Among the plurality of program states P0 to P3, the third program state P3 may be the highest state, and the 0-th program state P0 may be the lowest state. Here, the 0-th program state P0 may be an erased state in which each memory cell returns to the result of performing an erase operation.

Referring to FIG. 4B, each of memory cells programmed through a TLC scheme may have a threshold voltage that corresponds to a second threshold voltage distribution 420. Each memory cell may have one program state that corresponds to the threshold voltage thereof, among a plurality of program states P0 to P7. The plurality of program states P0 to P7 may include a 0-th program state P0 to a seventh program state P7. Among the plurality of program states P0 to P7, the seventh program state P7 may be the highest state, and the 0-th program state P0 may be the lowest state. Here, the 0-th program state P0 may be an erased state in which each memory cell returns to the result of performing an erase operation.

In an embodiment, in the case of the MLC scheme, the memory device 100 may identify respective program states of memory cells that are coupled to a selected word line by applying a read voltage having a first voltage level R1 to a third voltage level R3 to the selected word line. For example, the memory device 100 may identify respective program states of the memory cells while decreasing a read voltage in a stepwise manner. That is, the read voltage may be decreased in a stepwise manner such that a higher program state, among the plurality of program states, is sensed first. Further, the memory device 100 may decrease the voltage level of a first pass voltage that is applied to target word lines whenever the voltage level of the read voltage decreases. The target word lines may be word lines that are directly adjacent to the selected word line.

In detail, the control logic 130 may control the peripheral circuit 120 to apply the read voltage having a third voltage level R3 to the selected word line, among the plurality of word lines that are coupled to the memory block BLKz, and the pass voltage is applied to unselected word lines. Here, a memory cell having a threshold voltage at a level that is lower than the third voltage level R3 may be turned on. That is, a channel through which current can flow may be formed in the memory cell having a threshold voltage at a level that is lower than the third voltage level R3. Meanwhile, a memory cell having a threshold voltage at a level that is higher than the third voltage level R3 may be turned off. That is, a channel might not be formed in the memory cell having the threshold voltage at a level that is higher than the third voltage level R3. In this case, the control logic 130 may identify that the turned-off memory cell has the third program state P3.

Further, the control logic 130 may control the peripheral circuit 120 to apply the read voltage having a second voltage level R2 to the selected word line, among the plurality of word lines that are coupled to the memory block BLKz, and the pass voltage is applied to unselected word lines. Here, the control logic 130 may decrease the voltage level of the read voltage from the third voltage level R3 to the second voltage level R2. Also, when the read voltage decreases, the control logic 130 may decrease the level of the first pass voltage that is applied to target word lines, among the unselected word lines. Further, when the voltage levels of the read voltage and the first pass voltage decrease, the control logic 130 may maintain the level of the second pass voltage that is applied to the word lines other than the target word lines, among the unselected word lines. In this case, the memory device 100 may identify that turned-off memory cells, among the memory cells other than the memory cells having the third program state P3, have the second program state P2.

Furthermore, the control logic 130 may control the peripheral circuit 120 to apply the read voltage having a first voltage level R1 to the selected word line, among the plurality of word lines that are coupled to the memory block BLKz, and the pass voltage is applied to unselected word lines. Here, the control logic 130 may decrease the voltage level of the read voltage from the second voltage level R2 to the first voltage level R1. Also, when the read voltage decreases, the control logic 130 may decrease the level of the first pass voltage that is applied to target word lines, among the unselected word lines. Furthermore, the control logic 130 may maintain the level of the second pass voltage when the voltage levels of the read voltage and the first pass voltage decrease. In this case, the control logic 130 may identify that turned-off memory cells, among the memory cells other than the memory cells having the third program state P3 or the second program state P2, have the first program state P1. Furthermore, the control logic 130 may identify that turned-on memory cells have the 0-th program state P0.

Similarly, in the case of a TLC scheme, the memory device 100 may identify respective program states of memory cells that are coupled to a selected word line by applying a read voltage having a first voltage level R1 to a seventh voltage level R7 to the selected word line.

Figure 5A:
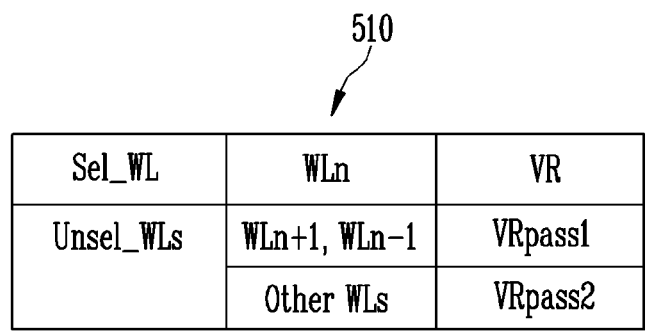
FIGS. 5A and 5B are diagrams illustrating voltages applied to word lines according to an embodiment.
Figure 5B:
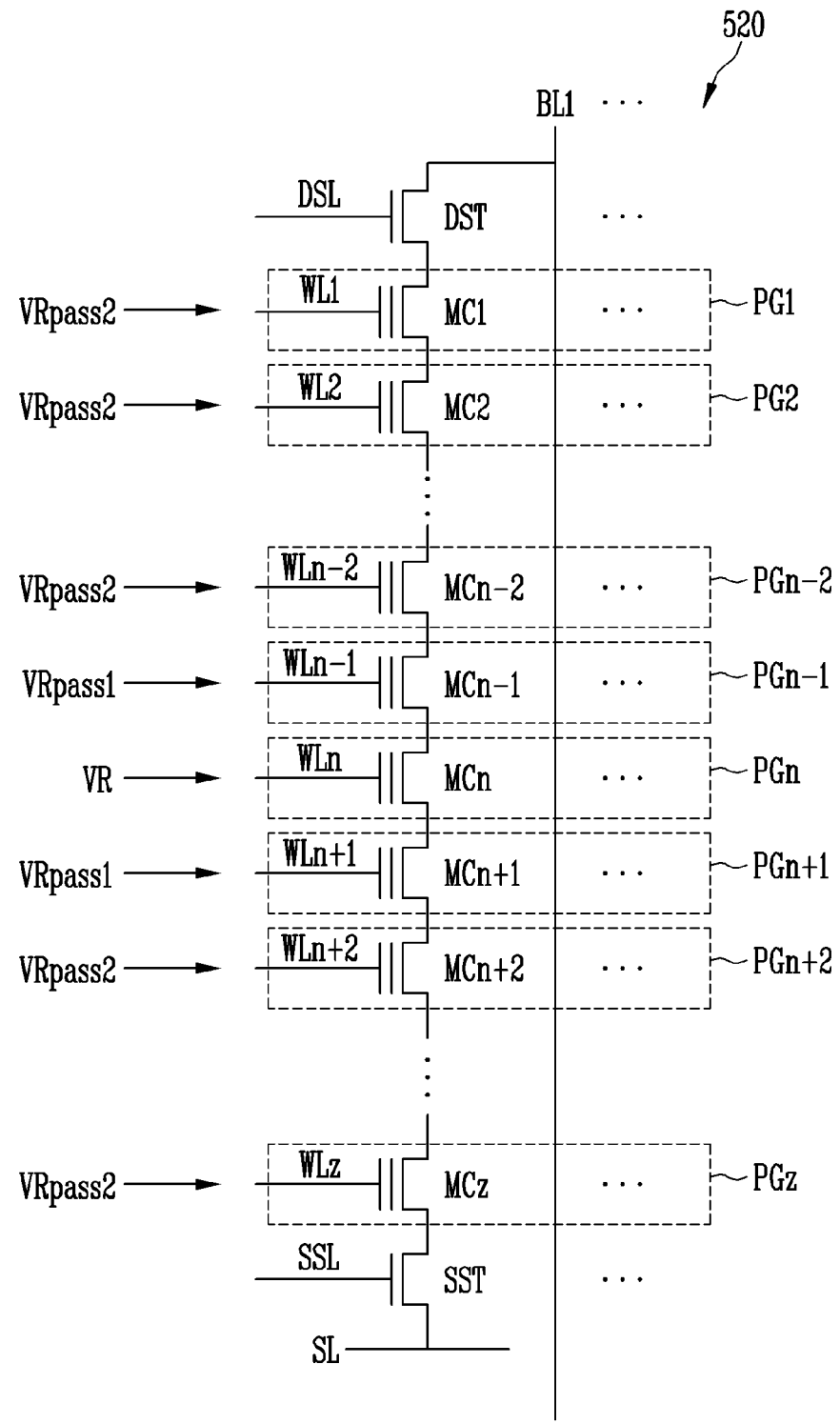

FIGS. 5A and 5B are diagrams illustrating voltages applied to word lines according to an embodiment. Here, a table 510 in FIG. 5A shows a read voltage VR that is applied to a selected word line Sel_WL and pass voltages VRpass1 and VRpass2 that are applied to unselected word lines Unsel_WLs during a read operation. FIG. 5B illustrates a memory block 520 that is coupled to the selected word line Sel_WL and the unselected word lines Unsel_WLs.

Referring to FIGS. 5A and 5B, when a read command and an address ADDR are received from the memory controller 200, the control logic 130 may determine the selected word line Sel_WL and the unselected word lines Unsel_WLs according to the address ADDR.

The selected word line Sel_WL may be a word line, among a plurality of word lines WL1 to WLz that are coupled to the memory block 520, indicated by the address ADDR. The unselected word lines Unsel_WLs may be word lines other than the selected word line Sel_WL, among the plurality of word lines WL1 to WLz that are coupled to the memory block 520. For example, when the selected word line Sel_WL is an n-th word line WLn, the unselected word lines Unsel_WLs may include the first word line WL1 to an n−1-th word line WLn−1 and an n+1-th word line WLn+1 to the z-th word line WLz.

Here, the control logic 130 may determine the n+1-th word line WLn+1 and the n−1-th word line WLn−1 that are directly adjacent to the selected word line Sel_WL, among the unselected word lines Unsel_WLs, to be the target word lines WLn+1 and WLn−1. Also, the control logic 130 may determine the word lines other than the target word lines WLn+1 and WLn−1, among the unselected word lines Unsel_WLs, to be other word lines Other WLs. In other words, the other word lines Other WLs may be remaining word lines. In an embodiment, when the selected word line Sel_WL is the n-th word line WLn, the remaining word lines may be word lines other than the target word lines WLn+1 and WLn−1, and the selected word line Sel_WL.

The memory cells MCn+1 and MCn−1 that are coupled to the target word lines WLn+1 and WLn−1 may have the nearest position relation with regard to the memory cell MCn that is coupled to the selected word line WLn. The nearest position relation may indicate that the distance between memory cells is the shortest. Accordingly, the level of the pass voltage that is applied to the target word lines WLn+1 and WLn−1 may influence the threshold voltage of the memory cell MCn that is coupled to the selected word line WLn or the selected word line WLn itself.

Also, the control logic 130 may control the peripheral circuit 120 to perform a read operation. For example, the read operation may be an operation to apply a read voltage VR to the n-th word line WLn, apply a first pass voltage VRpass1 to the target word lines WLn+1 and WLn−1 that are directly adjacent to the selected word line Sel_WL, among the unselected word lines Unsel_WLs, and apply a second pass voltage VRpass2 to the other word lines Other WLs, among the unselected word lines Unsel_WLs.

In an embodiment, the control logic 130 may decrease the voltage level of the read voltage VR from the first voltage level to the second voltage level based on the read voltage variation and may decrease the voltage level of the first pass voltage VRpass1 based on the pass voltage variation when the voltage level of the read voltage VR decreases. Here, the first voltage level may be a voltage level that is higher than the second voltage level. In an embodiment, the first voltage level may be a voltage level that is used to sense a first program state, among a plurality of program states, and the second voltage level may be a voltage level that is used to sense a second program state that is lower than the first program state, among the plurality of program states.

In detail, the control logic 130 may decrease the voltage level of the read voltage VR in a stepwise manner so that the voltage level is one of a plurality of voltage levels during a read operation. Each of the plurality of voltage levels may be a level that is preset to read one of the plurality of program states. That is, the control logic 130 may decrease the voltage level of the read voltage VR based on the read voltage variation for each step. Here, steps may be distinguished from each other according to the reference time.

The control logic 130 may decrease the voltage level of the first pass voltage VRpass1 when the voltage level of the read voltage VR decreases during the read operation. That is, the control logic 130 may decrease the voltage level of the first pass voltage VRpass1 based on the pass voltage variation for each step. Here, the pass voltage variation may have a value that is lower than that of the read voltage variation. In an embodiment, the control logic 130 may decrease the voltage level of the first pass voltage VRpass1 whenever the voltage level of the read voltage VR decreases during the read operation. Meanwhile, the control logic 130 may maintain the voltage level of the second pass voltage VRpass2 when the voltage level of the read voltage VR decreases during the read operation.

In an embodiment, whenever any one of the plurality of reference times is reached, the control logic 130 may decrease the voltage level of the read voltage VR based on the value of the read voltage variation that corresponds to the one reference time. Further, the control logic 130 may decrease the voltage level of the first pass voltage VRpass1 based on the value of the pass voltage variation that corresponds to any one reference time when the read voltage VR decreases.

In an embodiment, when the first reference time, among the plurality of reference times, is reached, the control logic 130 may decrease the voltage level of the read voltage VR based on the first value of the read voltage variation that corresponds to the first reference time. Furthermore, the control logic 130 may decrease the voltage level of the first pass voltage VRpass1 based on the first value of the pass voltage variation that corresponds to the first reference time when the voltage level of the read voltage VR decreases. The time point at which the read voltage VR decreases may be the first reference time. In an embodiment, the first value of the pass voltage variation may be a value that is obtained by multiplying a first ratio value by the first value of the read voltage variation.

Further, when a second reference time is reached after the first reference time, the control logic 130 may decrease the voltage level of the read voltage VR based on the second value of the read voltage variation that corresponds to the second reference time. Further, the control logic 130 may decrease the voltage level of the first pass voltage VRpass1 based on the second value of the pass voltage variation that corresponds to the second reference time when the read voltage VR decreases. The time point at which the read voltage VR decreases may be the second reference time. In an embodiment, the second value of the pass voltage variation may be a value that is obtained by multiplying a second ratio value by the second value of the read voltage variation.

In an embodiment, the first ratio value may be a value that is equal to or greater than the second ratio value. In other embodiments, the first ratio value may be a value that is less than or equal to the second ratio value.

Although, in FIG. 5B, one of the memory cells MC1 to MCz coupled to the first bit line BL1 is illustrated as being included in one page (one of PG1 to PGz), this configuration is merely provided for convenience of description, and may be modified and practiced in a form in which two or more memory cells are included in one page (one of PG1 to PGz).

Figure 6A:
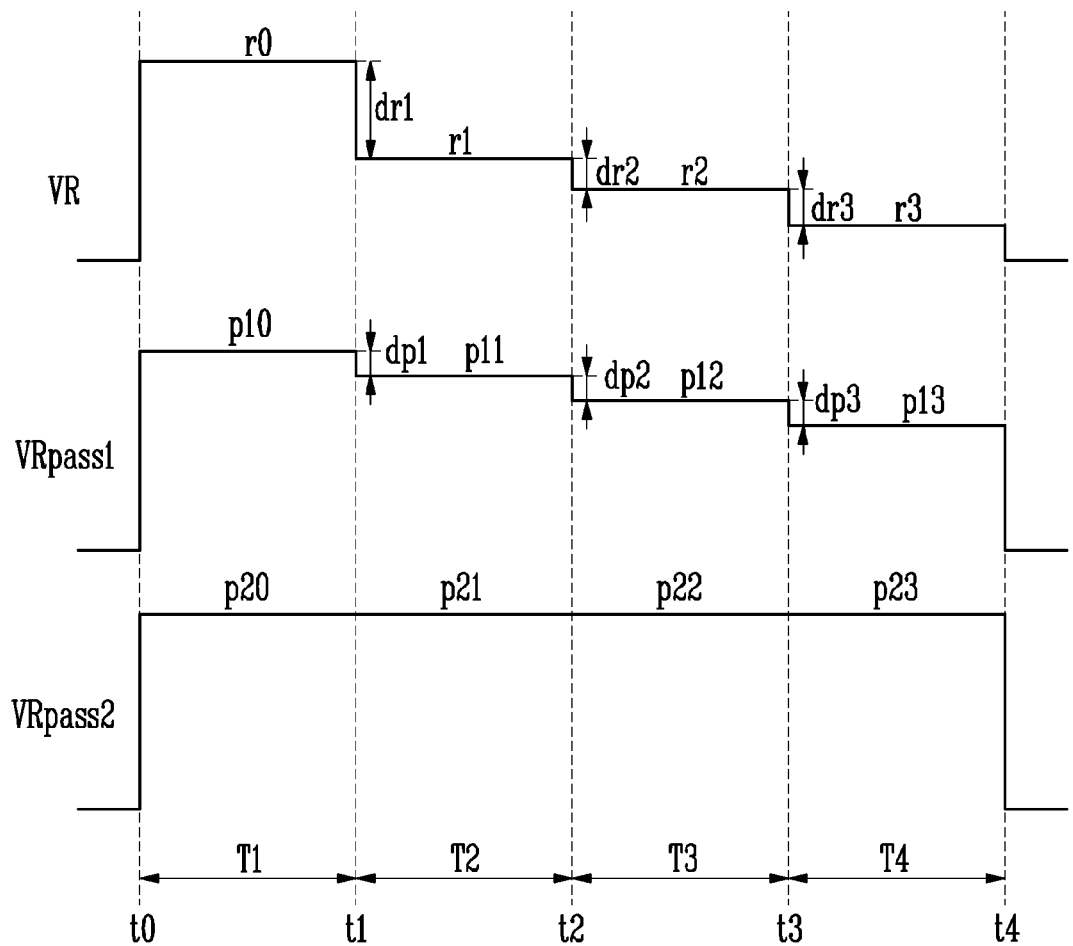
FIGS. 6A and 6B are timing diagrams illustrating the operation of a memory device according to an embodiment.
Figure 6B:
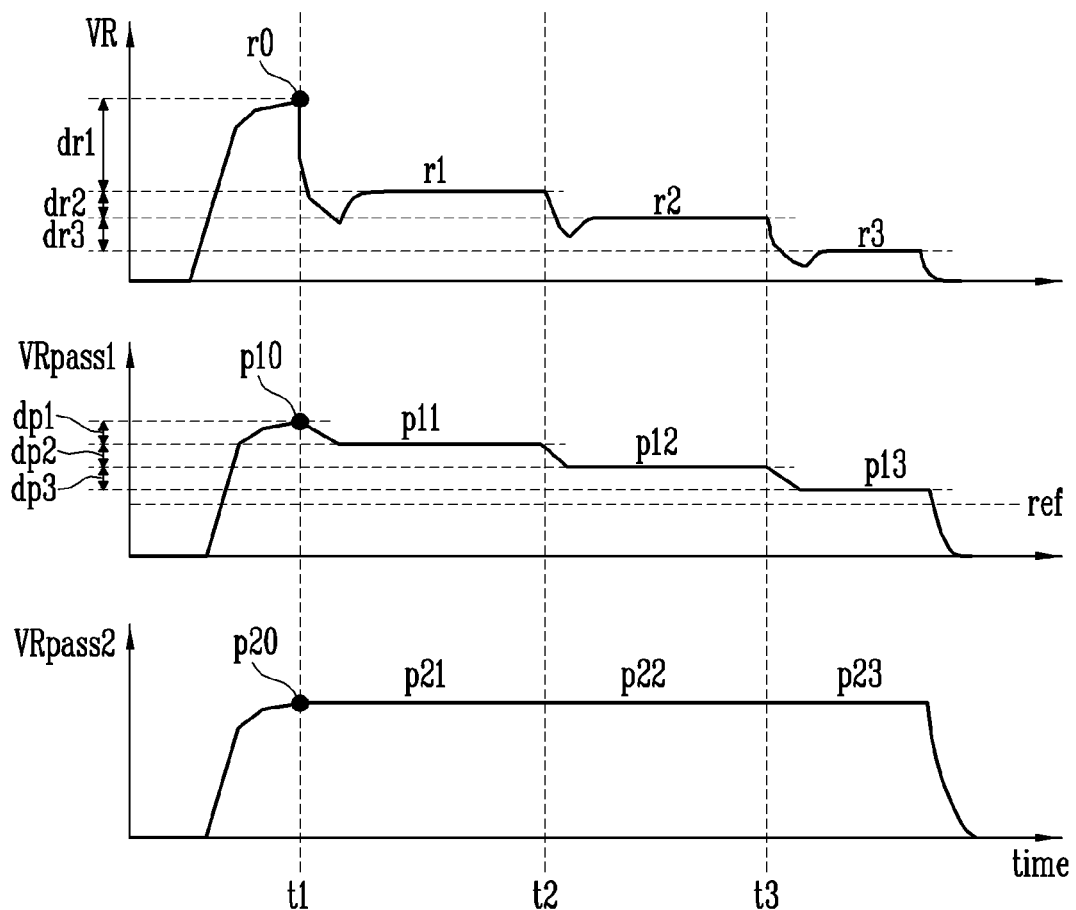

FIGS. 6A and 6B are timing diagrams illustrating the operation of a memory device according to an embodiment.

Referring to FIGS. 6A and 6B, the memory device 100 according to an embodiment may store level information of voltages. In an example, the level information may be stored in the table storage 133. In an example, the level information may be stored in a CAM block of the memory device 100. When a read command is received, the memory device 100 according to an embodiment may read data by applying voltages that correspond to respective word lines that are coupled to a memory block by using the level information. For example, the level information may be stored in the format, as illustrated in FIG. 6A. When an operation is performed using level information, the level of an actual voltage that is sensed may be indicated, as shown in the graph of FIG. 6B. Here, FIGS. 6A and 6B show the case in which data that is stored in an MLC scheme is read as an example.

The level information may include information about the levels of voltages that respectively correspond to a plurality of time intervals T1 to T4. For example, in the case of the MLC scheme, the plurality of time intervals T1 to T4 may include a first time interval T1 to a fourth time interval T4. In this case, the first time interval T1 may be a time interval during which an overcharge operation is performed. The second time interval T2 to the fourth time interval T4 may be time intervals during which a read operation is performed. The overcharge operation may be an operation to apply a voltage having a level that is equal to or higher than that of the voltage that is applied during the read operation. Meanwhile, the level information may be stored as data having various forms, such as a graph or a table.

In an embodiment, the level information may include information about the voltage levels r1, r2, and r3 of the read voltage VR, the voltage levels p11, p12, and p13 of the first pass voltage VRpass1, and the voltage levels p21, p22, and p23 of the second pass voltage VRpass2, which are applied to the second to fourth time intervals T2 to T4, respectively. In an embodiment, the level information may further include information about peak levels r1, p10, and p20 of overcharge voltages that are applied during the first time interval T1. The overcharge voltages may be voltages that are applied to the selected word line Sel_WL, the target word lines, and the other word lines during the first time period T1. The peak levels r0, p10, and p20 may include a first peak level r0, a second peak level p10, and a third peak level p20. In an example, the first peak level r0, the second peak level p10, and the third peak level p20 may be equal to each other. In an example, the first peak level r0, the second peak level p10, and the third peak level p20 may be different from each other. In an example, at least two of the first peak level r0, the second peak level p10, and the third peak level p20 may be equal to each other.

The voltage levels r1, r2, and r3 of the read voltage VR may include a first voltage level r1, a second voltage level r2, and a third voltage level r3. The first voltage level r1 of the read voltage VR may indicate the magnitude of the read voltage VR that is applied to the selected word line Sel_WL during the second time period T2. The second voltage level r2 of the read voltage VR may indicate the magnitude of the read voltage VR that is applied to the selected word line Sel_WL during the third time period T3 after the second time period T2. The third voltage level r3 of the read voltage VR may indicate the magnitude of the read voltage VR that is applied to the selected word line Sel_WL during the fourth time period T4 after the third time period T3.

The first voltage level r1 of the read voltage VR may be less than the first peak level r0 of the overcharge voltage. The second voltage level r2 of the read voltage VR may be less than the first voltage level r1. The third voltage level r3 of the read voltage VR may be less than the second voltage level r2. That is, the voltage levels r1, r2, and r3 of the read voltage VR may decrease in a stepwise manner in a sequence of the first voltage level r1, the second voltage level r2, and the third voltage level r3. In this case, the memory device 100 may sense memory cells having threshold voltages at a relatively high level by using the read voltage VR having a first voltage level r1 during the second time period T2. The memory device 100 may sense memory cells having threshold voltages at a relatively intermediate level by using the read voltage VR having a second voltage level r2 during the third time period T3. The memory device 100 may sense memory cells having threshold voltages at a relatively low level by using the read voltage VR having a third voltage level r3 during the fourth time period T4.

The voltage levels p11, p12, and p13 of the first pass voltage VRpass1 may include a first voltage level p11, a second voltage level p12, and a third voltage level p13. The first voltage level p11 of the first pass voltage VRpass1 may indicate the magnitude of the first pass voltage VRpass1 that is applied to the target word lines during the second time period T2. The second voltage level p12 may indicate the magnitude of the first pass voltage VRpass1 that is applied to the target word lines during the third time period T3. The third voltage level p13 may indicate the magnitude of the first pass voltage VRpass1 that is applied to the target word lines during the fourth time period T4.

The first voltage level p11 of the first pass voltage VRpass1 may be less than the second peak level p10 of the overcharge voltage. The second voltage level p12 of the first pass voltage VRpass1 may be less than the first voltage level p11. The third voltage level p13 of the first pass voltage VRpass1 may be less than the second voltage level p12. That is, the voltage levels p11, p12, and p13 of the first pass voltage VRpass1 may decrease in a stepwise manner in the sequence of the first voltage level p11, the second voltage level p12, and the third voltage level p13. However, this configuration is only an embodiment and may be modified and practiced in a form in which at least two of the first voltage level p11, the second voltage level p12, and the third voltage level p13 are equal to each other.

In an embodiment, the values dp1, dp2, and dp3 of the pass voltage variation may be determined based on the values dr1, dr2, and dr3 of the read voltage variation.

The values dr1, dr2, and dr3 of the read voltage variation may include a first value dr1, a second value dr2, and a third value dr3. In detail, the first value dr1 of the read voltage variation may be the difference between the first peak level r0 of the overcharge voltage and the first voltage level r1 of the read voltage VR at a first time point t1, and the first value dp1 of the pass voltage variation may be the difference between the second peak level p10 of the overcharge voltage and the first voltage level p11 of the first pass voltage VRpass1 at the first time point t1. The second value dr2 of the read voltage variation may be the difference between the first voltage level r1 and the second voltage level r2 of the read voltage VR at a second time point t2, and the second value dp2 of the pass voltage variation may be the difference between the first voltage level p11 and the second voltage level p12 of the first pass voltage VRpass1 at the second time point t2. The third value dr3 of the read voltage variation may be the difference between the second voltage level r2 and the third voltage level r3 of the read voltage VR at a third time point t3, and the third value dp3 of the pass voltage variation may be the difference between the second voltage level p12 and the third voltage level p13 of the first pass voltage VRpass1 at the third time point t3.

The voltage levels p21, p22, and p23 of the second pass voltage VRpass2 may include a first voltage level p21, a second voltage level p22, and a third voltage level p23. The first voltage level p21 of the second pass voltage VRpass2 may indicate the magnitude of the second pass voltage VRpass2 that is applied to the word lines Other WLs, among the unselected word lines Unsel_WLs, during the second time period T2. The second voltage level p22 may indicate the magnitude of the second pass voltage VRpass2 applied to the word lines Other WLs, among the unselected word lines Unsel_WLs, during the third time period T3. The third voltage level p23 may indicate the magnitude of the second pass voltage VRpass2 applied to the word lines Other WLs, among the unselected word lines Unsel_WLs, during the fourth time period T4.

The first voltage level p21 of the second pass voltage VRpass2 may be less than or equal to the third peak level p20 of the overcharge voltage. The second voltage level p22 of the second pass voltage VRpass2 may be equal to the first voltage level p21. The third voltage level p23 of the second pass voltage VRpass2 may be equal to the second voltage level p22. That is, the voltage levels p21, p22, and p23 of the second pass voltage VRpass2 may be maintained at the same level as in the case of the first voltage level p21, the second voltage level p22, and the third voltage level p23.

The control logic 130 according to a detailed embodiment may perform an operation by using the level information when a read command and an address ADDR are received. Here, it is assumed that the address ADDR indicates the n-th word line or an n-th page that is coupled to the n-th word line WLn.

In this case, the control logic 130 may determine the n-th word line WLn that is indicated by the address ADDR to be a selected word line Sel_WL. Further, the control logic 130 may determine the n+1-th word line WLn+1 and the n−1-th word line WLn−1 that is adjacent to the n-th word line Sel_WL, among unselected word lines Unsel_WLs, to be the target word lines WLn+1 and WLn−1. Furthermore, the control logic 130 may determine word lines other than the target word lines WLn+1 and WLn−1, among the unselected word lines Unsel_WLs, to be other word lines Other WLs. Here, the unselected word lines Unsel_WLs may include word lines other than the selected word lines Sel_WL, among the plurality of word lines that are included in the memory block.

At a 0-th time point t0, the control logic 130 may control the peripheral circuit 120 to perform an overcharge operation that applies the overcharge voltage to the selected word line Sel_WL, the target word lines WLn+1 and WLn−1, and the other word lines Other WLs. Here, the overcharge voltage may be a voltage that is applied before a read operation is performed.

The control logic 130 may increase the voltage level of the overcharge voltage until the voltage level of the overcharge voltage reaches the peak levels r0, p10, and p20. The overcharge voltage may be the voltage that is applied before a read operation in order to allow the level of the voltage that is applied to each word line to rapidly reach a target level and may be advantageous in that the time that is required for the read operation may be shortened. For example, a time period during which the overcharge operation is performed may be the first time period T1, and a time period during which the read operation is performed may include the second to fourth time periods T2 to T4.

In an embodiment, the peak level r0 of the overcharge voltage that is applied to the selected word line Sel_WL, the peak level p10 of the overcharge voltage that is applied to the target word lines WLn+1 and WLn−1, and the peak level p20 of the overcharge voltage that is applied to the other word lines Other WLs may be equal to each other. In this case, each peak level may be the voltage level for turning on the channel of the corresponding memory cell. For example, the peak level may be the voltage level of the second pass voltage VRpass2 that is maintained during a read operation. However, this configuration is only an embodiment, and at least two of the peak level r0 of the overcharge voltage that is applied to the selected word line Sel_WL, the peak level p10 of the overcharge voltage that is applied to the target word lines WLn+1 and WLn−1, and the peak level p20 of the overcharge voltage that is applied to the other word lines Other WLs may be different voltage levels.

At the first time point t1, the control logic 130 may control the peripheral circuit 120 to perform a read operation. In an embodiment, the first time point t1 may be a time point at which the level of the overcharge voltage reaches a reference level or a time point subsequent thereto. For example, referring to FIG. 6B, in an embodiment, the control logic 130 may increase the level of the overcharge voltage that is applied to the selected word line Sel_WL until the level of the overcharge voltage reaches the reference level. Here, the reference level may be the peak level r0. The control logic 130 may control the peripheral circuit 120 to perform a read operation when the level of the overcharge voltage reaches the reference level.

In an embodiment, at the first time point t1, the control logic 130 may control the peripheral circuit 120 to apply the read voltage VR to the selected word line Sel_WL, the first pass voltage VRpass1 to the target word lines WLn+1 and WLn−1, and the second pass voltage VRpass2 to the other word lines Other WLs. In an embodiment, the read voltage VR, the first pass voltage VRpass1, and the second pass voltage VRpass2 may be the voltages that are decreased from the voltage level of the overcharge voltage.

In an embodiment, at the first time point t1 at which the second time period T2 starts, the control logic 130 may control the peripheral circuit 120 to apply the read voltage VR having the first voltage level r1, decreased based on the first value dr1 of the read voltage variation, to the selected word line Sel_WL. The first value dr1 of the read voltage variation may be a preset value that indicates the difference between the first peak level r0 of the overcharge voltage and the first voltage level r1 of the read voltage VR. In this case, the control logic 130 may control the peripheral circuit 120 to apply the first pass voltage VRpass1 having the first voltage level p11, decreased based on the first value dp1 of the pass voltage variation, to the target word lines WLn+1 and WLn−1. The first value dp1 of the pass voltage variation may be a preset value that indicates the difference between the second peak level p10 of the overcharge voltage and the first voltage level p11 of the first pass voltage VRpass1.

After the first time point t1, the voltage level of the selected word line Sel_WL may be decreased based on the first value dr1 of the read voltage variation and may then be maintained at the first voltage level r1. In this case, the voltage levels of the target word lines WLn+1 and WLn−1 may be decreased based on the first value dp1 of the pass voltage variation and may then be maintained at the first voltage level p11. The voltage levels of the other word lines Other WLs may be maintained at the first voltage level p21. In an embodiment, the first value dp1 of the pass voltage variation may be less than the first value dr1 of the read voltage variation. In other embodiments, the first value dp1 of the pass voltage variation may be equal to the first value dr1 of the read voltage variation. Furthermore, the control logic 130 may sense memory cells, among the selected memory cells that are coupled to the selected word line Sel_WL, having a program state that corresponds to the first voltage level r1. For example, in the case of an MLC, the program state that corresponds to the first voltage level r1 may be the third program state P3 illustrated in FIG. 4A.

At the second time point t2, the control logic 130 may decrease the read voltage VR based on the second value dr2 of the read voltage variation. The control logic 130 may decrease the first pass voltage VRpass1 based on the second value dp2 of the pass voltage variation when the read voltage VR decreases.

After the second time point t2, the voltage level of the selected word line Sel_WL may be decreased based on the second value dr2 of the read voltage variation and may then be maintained at the second voltage level r2. In this case, the voltage levels of the target word lines WLn+1 and WLn−1 may be decreased based on the second value dp2 of the pass voltage variation and may then be maintained at the second voltage level p12. The voltage levels of the other word lines Other WLs may be maintained at the second voltage level p22. In an embodiment, the second value dp2 of the pass voltage variation may be less than the second value dr2 of the read voltage variation. In other embodiments, the second value dp2 of the pass voltage variation may be equal to the second value dr2 of the read voltage variation. Furthermore, the control logic 130 may sense memory cells, among the selected memory cells that are coupled to the selected word line Sel_WL, having a program state that corresponds to the second voltage level r2. For example, in the case of an MLC, the program state that corresponds to the second voltage level r2 may be the second program state P2 illustrated in FIG. 4A.

At the third time point t3, the control logic 130 may decrease the read voltage VR based on the third value dr3 of the read voltage variation. The control logic 130 may decrease the first pass voltage VRpass1 based on the third value dp3 of the pass voltage variation when the read voltage VR decreases.

After the third time point t3, the voltage level of the selected word line Sel_WL may be decreased based on the third value dr3 of the read voltage variation and may then be maintained at the third voltage level r3. In this case, the voltage levels of the target word lines WLn+1 and WLn−1 may be decreased based on the third value dp3 of the pass voltage variation and may then be maintained at the third voltage level p13. The voltage levels of the other word lines Other WLs may be maintained at the third voltage level p23. In an embodiment, the third value dp3 of the pass voltage variation may be less than the third value dr3 of the read voltage variation. In other embodiments, the third value dp3 of the pass voltage variation may be equal to the third value dr3 of the read voltage variation. Furthermore, the control logic 130 may sense memory cells, among the selected memory cells that are coupled to the selected word line Sel_WL, having a program state that corresponds to the third voltage level r3. For example, in the case of the MLC scheme, the program state that corresponds to the third voltage level r3 may be the first program state P1 or the 0-th program state P0 as illustrated in FIG. 4A.

Meanwhile, referring to FIG. 6B, the time from the first time point t1 to the time point at which the level of the read voltage VR changes from the reference level r0 to the first voltage level r1, the time from the second time point t2 to the time point at which the level of the read voltage VR changes from the first voltage level r1 to the second voltage level r2, and the time from the third time point t3 to the time point at which the level of the read voltage VR changes from the second voltage level r2 to the third voltage level r3 may correspond to a delay time that delays the operation time required for the read operation. In accordance with an embodiment of the present disclosure, the levels of the first pass voltage VRpass1 that is applied to the target word lines WLn+1 and WLn−1 that are adjacent to the selected word line Sel_WL may be decreased together at a synchronized time, and thus, there is an advantage in that the delay time is reduced.

In accordance with an embodiment, the first pass voltage VRpass1 may have a voltage level that is higher than a lower limit level ref. Here, the lower limit level may be a level at which the channel of a memory cell can be turned on and may be preset. For example, when the difference between the level of the first pass voltage VRpass1 and the value of the pass voltage variation is determined to be less than or equal to the lower limit level ref, the control logic 130 may adjust the first pass voltage VRpass1 to have the lower limit level ref.

FIG. 7 is a diagram illustrating a voltage variation according to an embodiment.

Referring to FIG. 7, the table storage 133 may store first voltage information 710. The first voltage information 710 may include information about a variance in the level of a read voltage VR and a variance in the level of a first pass voltage VRpass1. For example, the first voltage information 710 may include the values dr1 to dr3 of the read voltage variation and the values dp1 to dp3 of the pass voltage variation, which correspond to a plurality of reference times t1 to t3.

In an embodiment, the first voltage information 710 may include the first value dr1 of the read voltage variation that corresponds to the first reference time t1, the second value dr2 of the read voltage variation that corresponds to the second reference time t2, and the third value dr3 of the read voltage variation that corresponds to the third reference time t3. In an embodiment, the first voltage information 710 may include the first value dp1 of the pass voltage variation that corresponds to the first reference time t1, the second value dp2 of the pass voltage variation that corresponds to the second reference time t2, and the third value dp3 of the pass voltage variation that corresponds to the third reference time t3.

In this case, at the first reference time t1, the operation controller 131 may decrease the read voltage VR based on the first value dr1 of the read voltage variation and decrease the first pass voltage VRpass1 based on the first value dp1 of the pass voltage variation. Thereafter, at the second reference time t2, the operation controller 131 may decrease the read voltage VR based on the second value dr2 of the read voltage variation and decrease the first pass voltage VRpass1 based on the second value dp2 of the pass voltage variation. Thereafter, at the third reference time t3, the operation controller 131 may decrease the read voltage VR based on the third value dr3 of the read voltage variation and decrease the first pass voltage VRpass1 based on the third value dp3 of the pass voltage variation.

In an embodiment, the first value dp1 of the pass voltage variation may be less than the first value dr1 of the read voltage variation. The second value dp2 of the pass voltage variation may be less than the second value dr2 of the read voltage variation. The third value dp3 of the pass voltage variation may be less than the third value dr3 of the read voltage variation.

In other embodiments, the first value dp1 of the pass voltage variation may be equal to the first value dr1 of the read voltage variation. The second value dp2 of the pass voltage variation may be equal to the second value dr2 of the read voltage variation. The third value dp3 of the pass voltage variation may be equal to the third value dr3 of the read voltage variation.

Meanwhile, the first voltage information 710 may be modified and implemented in a configuration including the voltage levels r1, r2, and r3 of the read voltage VR instead of the values dr1, dr2, and dr3 of the read voltage variation. Also, the first voltage information 710 may be modified and implemented in a configuration including the voltage levels p11, p12, and p13 of the first pass voltage VRpass1 instead of the second value dp2 of the pass voltage variation.

Meanwhile, the number of values that are included in the above-described first voltage information 710 may be variously modified and implemented based on the scheme such as the MLC, TLC, or QLC scheme.

FIGS. 8A to 8E are diagrams illustrating a voltage variation according to an embodiment.

Figure 8B:
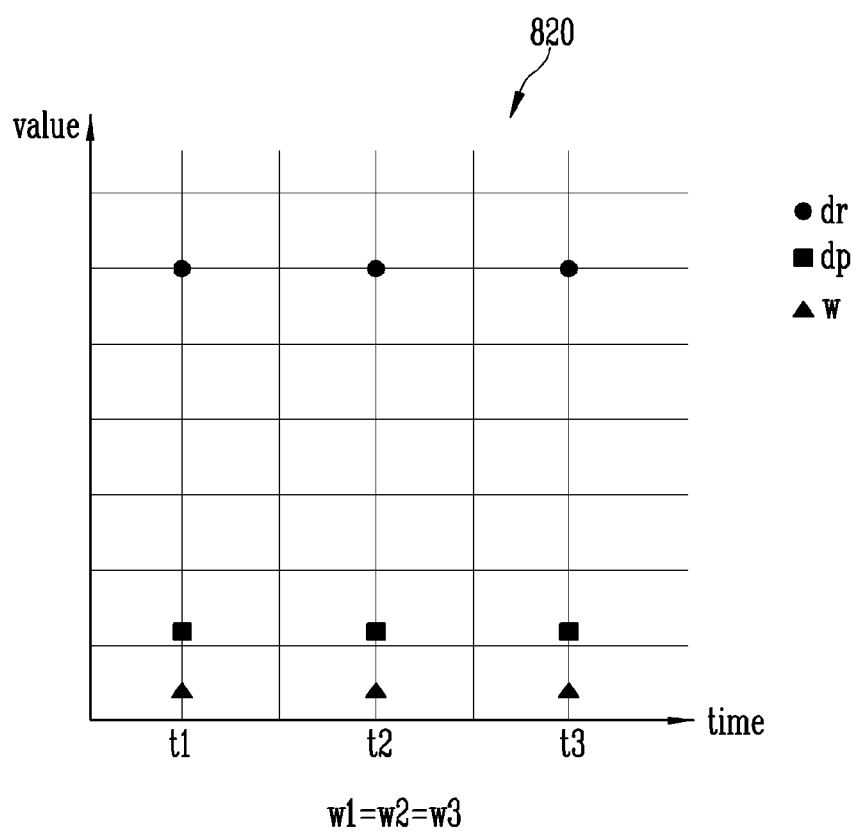

Referring to FIGS. 8A and 8B, the table storage 133 may store second voltage information 810. For example, the second voltage information 810 may include the values dr1 to dr3 of the read voltage variation and the values dp1 to dp3 of the pass voltage variation, which correspond to a plurality of reference times t1 to t3.

In an embodiment, the second voltage information 810 may include the first value dr1 of the read voltage variation that corresponds to the first reference time t1, the first value dp1 of the pass voltage variation that corresponds to the first reference time t1, the second value dr2 of the read voltage variation that corresponds to the second reference time t2, the second value dp2 of the pass voltage variation that corresponds to the second reference time t2, the third value dr3 of the read voltage variation that corresponds to the third reference time t3, and the third value dp3 of the pass voltage variation that corresponds to the third reference time t3.

In an embodiment, the second voltage information 810 may include the values dr1 to dr3 of the read voltage variation and ratio values w1 to w3, which correspond to the plurality of reference times t1 to t3. In this case, the values dp1 to dp3 of the pass voltage variation may be determined using values obtained by multiplying the ratio values w1 to w3 by the values dr1 to dr3 of the read voltage variation. Each of the ratio values w1 to w3 may be a value that is greater than 0 and less than 1. Each of the ratio values w1 to w3 may be a preset value.

In accordance with an embodiment, as shown in FIGS. 8A and 8B, the first ratio value w1, the second ratio value w2, and the third ratio value w3 may be the same value. In this case, as in the case of a first graph 820, when the read voltage VR decreases based on the first value dr1 of the read voltage variation at the first reference time t1, the first pass voltage VRpass1 may decrease based on the first value dp1 of the pass voltage variation that is obtained by multiplying the first ratio value w1 by the first value dr1 of the read voltage variation at the first reference time t1. In this way, the levels of the first pass voltage VRpass1 that is respectively decreased at subsequent reference times t2 and t3 may be determined.

Figure 8C:
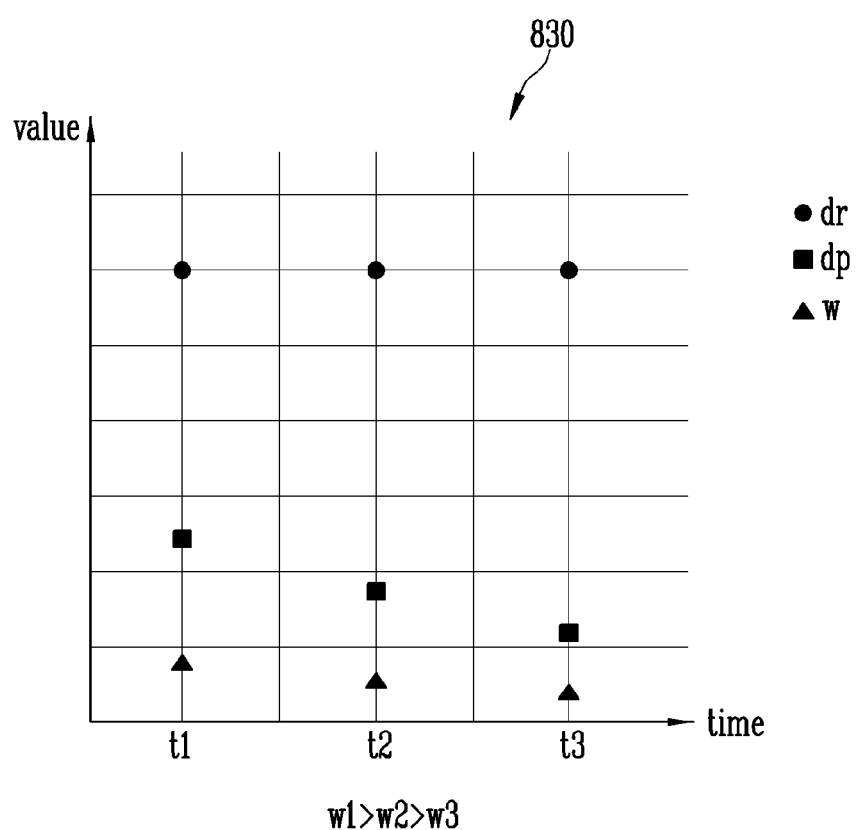

In accordance with an embodiment, as shown in FIGS. 8A and 8C, the first ratio value w1 may be set to a value that is greater than the second ratio value w2, and the second ratio value w2 may be set to a value that is greater than the third ratio value w3. In accordance with an embodiment, as shown in FIGS. 8A and 8D, the third ratio value w3 may be set to a value that is greater than the second ratio value w2, and the second ratio value w2 may be set to a value that is greater than the first ratio value w1.

In accordance with an embodiment, as illustrated in FIGS. 8A and 8E, at least two of the plurality of ratio values w1 to w3 may be the same value. For example, the first ratio value w1 may be set to a value that is greater than the second ratio value w2, and the second ratio value w2 may be set to a value that is equal to the third ratio value w3. In other examples, the first ratio value w1 may be set to a value that is equal to the second ratio value w2, and the second ratio value w2 may be set to value that is greater than the third ratio value w3.

Figure 9:
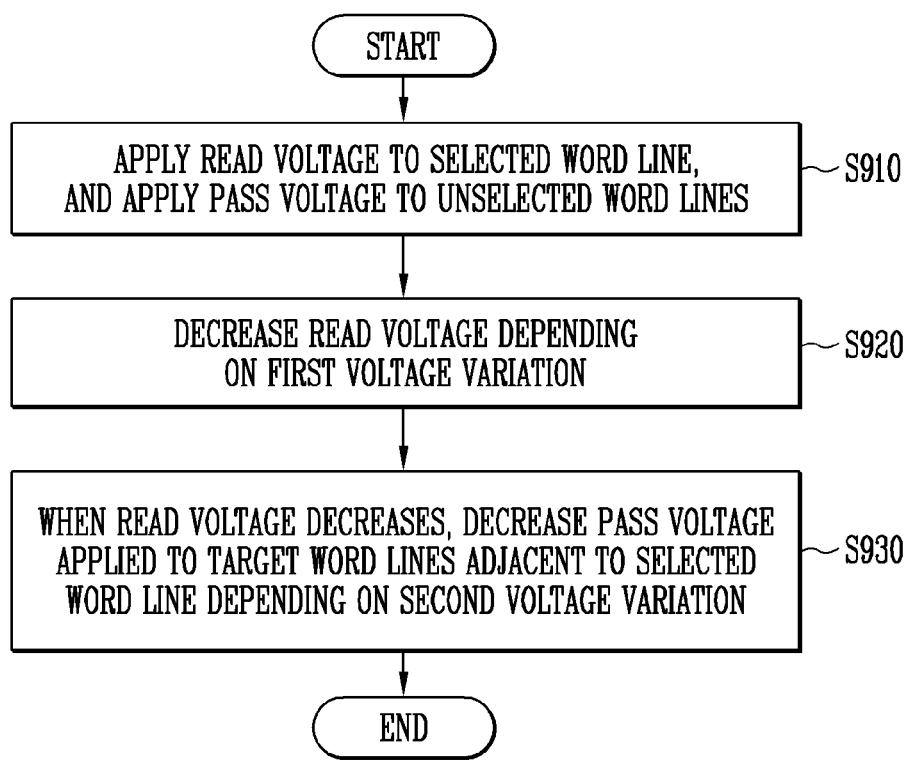
FIG. 9 is a flowchart illustrating the operation of a memory device according to an embodiment.

FIG. 9 is a flowchart illustrating the operation of a memory device according to an embodiment.

Referring to FIG. 9, a method of operating the memory device 100 may include step S910 of applying a read voltage VR to a selected word line Sel_WL, among a plurality of word lines WL1 to WLz coupled to a memory block included in the memory device 100 and applying pass voltages VRpass1 and VRpass2 to unselected word lines Unsel_WLs, step S920 of decreasing the read voltage VR based on a first voltage variation, and step S930 of decreasing the pass voltage VRpass1 applied to target word lines WLn+1 and WLn−1 that are directly adjacent to the selected word line Sel_WL, among the unselected word lines Unsel_WLs, based on a second voltage variation, the second voltage variation being less than the first voltage variation, when the read voltage VR decreases.

In detail, the read voltage VR may be applied to the selected word lines Sel_WL, among the plurality of word lines WL1 to WLz, and the pass voltages VRpass1 and VRpass2 may be applied to the unselected word lines Unsel_WLs at step S910. The plurality of word lines WL1 to WLz may be coupled to the memory block that is included in the memory device 100. The selected word line Sel_WL may be a word line, among the plurality of word lines WL1 to WLz, corresponding to an address that is received by the memory device 100. The unselected word lines Unsel_WLs may be word lines other than the selected word line Sel_WL, among the plurality of word lines WL1 to WLz. The pass voltages VRpass1 and VRpass2 may include a first pass voltage VRpass1 and a second pass voltage VRpass2.

In an embodiment, before the read voltage VR and the pass voltages VRpass1 and VRpass2 are applied, an overcharge voltage may be applied to each of the selected word line Sel_WL, the target word lines WLn+1 and WLn−1, and other word lines Other WLs.

In an embodiment, after the overcharge voltage has been applied, the level of the overcharge voltage may be increased until the level of the overcharge reaches a reference level. Also, when the level of the overcharge voltage has reached the reference level, the read voltage VR having a level that subtracts the read voltage variation from the reference level, may be applied to the selected word line Sel_WL. Also, when the read voltage VR having the decreased level is applied to the selected word line Sel_WL, the first pass voltage VRpass1 having a level that subtracts the pass voltage variation from reference level, may be applied to the target word lines WLn+1 and WLn−1. In this case, the level of the second pass voltage VRpass2 applied to the word lines Other WLs, among the unselected word lines Unsel_WLs, may be maintained.

Here, the reference level may be a level that is higher than voltage levels preset to sense a plurality of program states. In the case of an MLC scheme, as the levels of the read voltage, a first voltage level, a second voltage level, and a third voltage level may be preset. Here, the voltage levels may be decreased in the sequence of the first voltage level to the third voltage level. Here, the reference level may be a level that is higher than the first voltage level.

In an embodiment, the states of selected memory cells that are coupled to the selected word line Sel_WL, among the plurality of memory cells that are included in the memory block, may be sensed by applying the read voltage VR having the first voltage level to the selected word line Sel_WL. Here, the first voltage level may be a level that corresponds to the difference between the reference level and the read voltage variation.

Also, the read voltage VR may be decreased based on the first voltage variation at step S920. Here, the first voltage variation may be the above-described read voltage variation. In an embodiment, whenever a preset reference time elapses, the read voltage VR may be decreased based on the first voltage variation. The level of the read voltage VR may be decreased based on the value of the first voltage variation that corresponds to the reference time.

Further, when the read voltage VR decreases, the first pass voltage VRpass1 that is applied to the target word lines WLn+1 and WLn-1 that are directly adjacent to the selected word line Sel_WL, among the unselected word lines Unsel_WLs, may be decreased based on the second voltage variation at step S930. The second voltage variation may be less than the first voltage variation. Here, the second voltage variation may be the above-described pass voltage variation.

In an embodiment, a value that is obtained by multiplying a ratio value that is less than 1 by the first voltage variation may be determined to be the second voltage variation.

In this case, when the read voltage VR decreases, the level of the second pass voltage VRpass2 that is applied to the word lines Other WLs, among the unselected word lines Unsel_WLs, may be maintained.

Furthermore, the step of decreasing the read voltage VR may be performed such that, after the states of the selected memory cells are sensed, the read voltage VR may be decreased from the first voltage level to the second voltage level based on the first voltage variation. Here, the first voltage level may be a level that is higher than the second voltage level.

In an embodiment, the first voltage level may be a voltage level that is used to sense a first program state, among a plurality of program states, and the second voltage level may be a voltage level that is used to sense a second program state that is lower than the first program state, among the plurality of program states.

In an embodiment, when the reference time has elapsed when the read voltage VR decreases, the read voltage VR may be decreased based on the first voltage variation, and the first pass voltage VRpass1 that is applied to the target word lines WLn+1 and WLn-1 may be decreased based on the second voltage variation. Here, the reference time may be a preset time.

As described above, the memory device 100 and the method of operating the memory device 100, according to embodiments of the present disclosure, may decrease the first pass voltage VRpass1 that is applied to the target word lines WLn+1 and WLn-1 that are directly adjacent to the selected word line Sel_WL, together with the read voltage, when the read voltage decreases. That is, the memory device 100 and the method of operating the memory device 100, according to embodiments of the present disclosure, may decrease the first pass voltage VRpass1 that is applied to the target word lines WLn+1 and WLn-1, together with the read voltage, in synchronization with the time point at which the read voltage decreases. Accordingly, the voltage difference between the selected word line Sel_WL and the target word lines WLn+1 and WLn-1 that are directly adjacent to each other may be decreased, and thus, capacitance induced between the word lines may be removed. As a result, the level of the read voltage that is applied to the selected word line Sel_WL may rapidly reach a specific level.

Furthermore, the pass voltage variation of the first pass voltage VRpass1 may be less than the read voltage variation of the read voltage VR. In particular, as the pass voltage variation is larger, the length of a valid channel of a selected memory cell that is coupled to the selected word line Sel_WL or the threshold voltage of the selected memory cell is changed, so that a problem may arise in that the reliability of data that is read from the selected memory cell is deteriorated, and thus, the embodiment of the present disclosure may effectively prevent the above-described problem.

Figure 10:
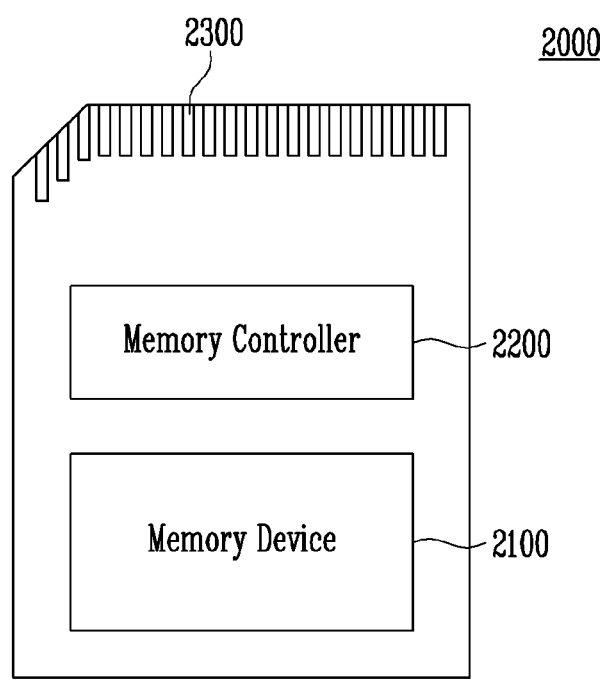
FIG. 10 is a block diagram illustrating a memory card to which a memory system according to an embodiment is applied.

FIG. 10 is a block diagram illustrating a memory card to which a memory system according to an embodiment is applied.

Referring to FIG. 10, a memory card 2000 may include a memory device 2100, a memory controller 2200, and a connector 2300.

The memory device 2100 may perform a program operation of storing data, a read operation of reading data, or an erase operation of deleting data. In an embodiment, the memory device 2100 may be implemented as any of various nonvolatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and a spin transfer torque magnetic RAM (STT-MRAM). The description of the memory device 100, made above with reference to FIG. 1, may be equally applied to the memory device 2100, and repeated descriptions thereof will be omitted.

The memory controller 2200 may control the memory device 2100. For example, the memory controller 2200 may execute an instruction for controlling the memory device 2100. The memory controller 2200 may control the memory device 2100 to perform a program operation, a read operation, or an erase operation. The memory controller 2200 may transfer data, a command, or the like between the memory device 2100 or a host through communication. In an embodiment, the memory controller 2200 may include components, such as a RAM, a processor, a host interface, a memory interface, and an error correction circuit. The description of the memory controller 200, made above with reference to FIG. 1, may be equally applied to the memory controller 2200, and repeated descriptions thereof will be omitted below.

The memory controller 2200 may communicate with an external device through the connector 2300. The memory controller 2200 may communicate with an external device (e.g., a host) based on a specific communication protocol. In an embodiment, the memory controller 2200 may communicate with the external device through at least one of various interface protocols, such as universal serial bus (USB), multimedia card (MMC), embedded MMC (eMMC), peripheral component interconnection (PCI), PCI-express (PCI-E), an advanced technology attachment (ATA) protocol, a serial-ATA (SATA), parallel-ATA (PATA), small computer system interface (SCSI), enhanced small disk interface (ESDI), integrated drive electronics (IDE), firewire, universal flash storage (UFS), Wi-Fi, Bluetooth, and nonvolatile memory express (NVMe) protocols. In an embodiment, the connector 2300 may be defined by at least one of the above-described various communication protocols. The memory device 2100 and the memory controller 2200 may be integrated into a single semiconductor device to form the memory card. For example, the memory device 2100 and the memory controller 2200 may be integrated into a single semiconductor device, and may then be manufactured in the form of a memory card such as a compact flash card, a smart media card, a memory stick, a multimedia card, a SD card, or a universal flash storage (UFS).

Figure 11:
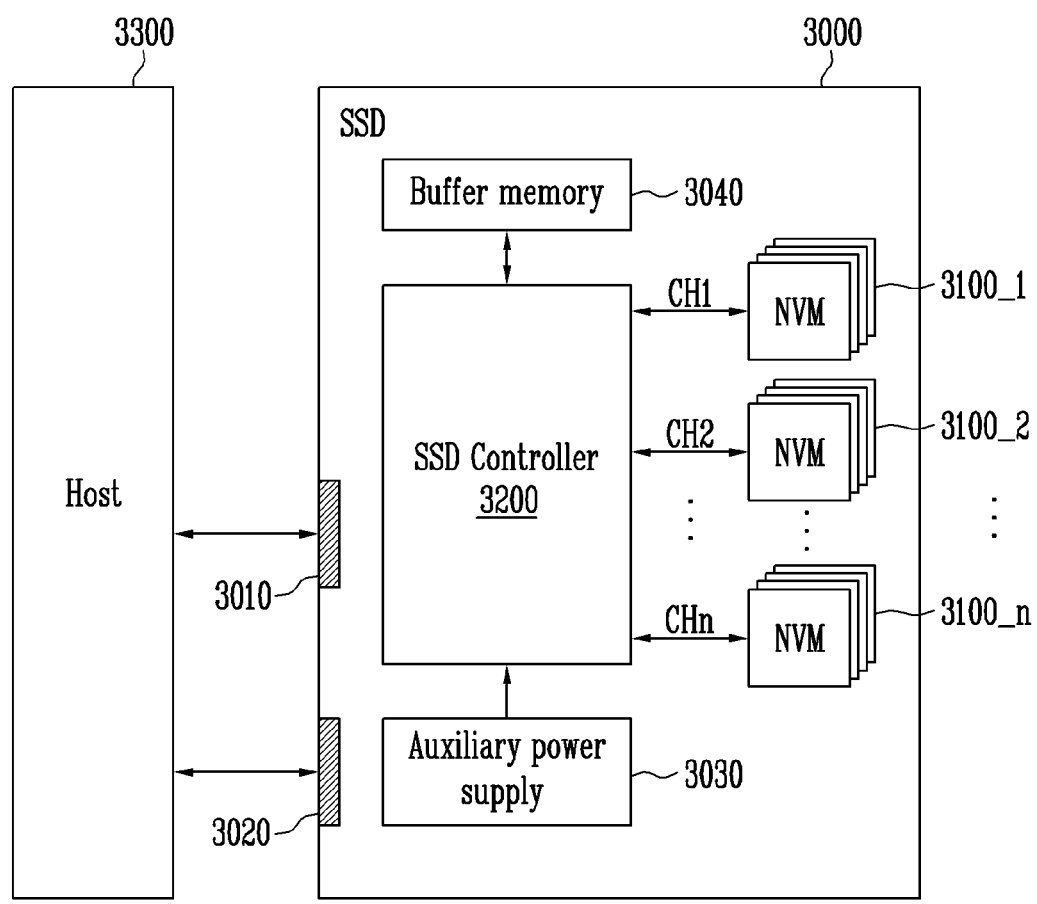
FIG. 11 is a block diagram illustrating a solid state drive (SSD) system to which a memory system according to an embodiment is applied.

FIG. 11 is a block diagram illustrating a solid state drive (SSD) system to which a memory system according to an embodiment is applied.

Referring to FIG. 11, an SSD 3000 may include a plurality of nonvolatile memory devices 3100_1 to 3100_n, an SSD controller 3200, a signal connector 3010, a power connector 3020, an auxiliary power supply 3030, and a buffer memory 3040.

The SSD 3000 may communicate with a host 3300 through the signal connector 3010. The signal connector 3010 may be implemented in the form of an interface complying with any of various communication methods. For example, the signal connector 3010 may be one of interfaces complying with various communication methods, such as a Serial ATA (SATA) interface, a mini-SATA (mSATA) interface, a PCI Express (PCIe) interface, and an M.2 interface.

The plurality of first nonvolatile memory devices 3100_1 may coupled to the SSD controller 3200 through a first channel CH1, the plurality of second nonvolatile memory devices 3100_2 may be coupled to the SSD controller 3200 through a second channel CH2, and the plurality of nonvolatile memory devices 3100_n may be coupled to the SSD controller 3200 may be coupled to the SSD controller 3200 through an n-th channel CHn. Accordingly, the SSD controller 3200 may perform communication in parallel with nonvolatile memory devices coupled thereto through independent channels.

Meanwhile, the description of the memory device 100, made above with reference to FIG. 1, may be equally applied to each of the plurality of nonvolatile memory devices 3100_1 to 3100_n, and repeated descriptions thereof will be omitted below. The description of the memory controller 200, made above with reference to FIG. 1, may be equally applied to the SSD controller 3200, and repeated descriptions thereof will be omitted below.

The SSD 3000 may be supplied with external power from the host 3300 through the power connector 3020. The auxiliary power supply 3030 may be coupled to the host 3300 through the power connector 3020. The auxiliary power supply 3030 may be supplied with power from the host 3300, and may be charged. The auxiliary power supply 3030 may supply the power of the SSD 3000 when the supply of power from the host 3300 is not smoothly performed. In an embodiment, the auxiliary power supply 3030 may be located inside the SSD 3000 or located outside the SSD 3000. For example, the auxiliary power supply 3030 may be located in a main board, and may also provide auxiliary power to the SSD 3000.

The buffer memory 3040 may function as a buffer memory of the SSD 3000. For example, the buffer memory 3040 may temporarily store data that is received from the host 3300 or data that is received from the plurality of nonvolatile memory devices 3100_1 to 3100_n, or may temporarily store metadata (e.g., mapping tables) of the nonvolatile memory devices 3100_1 to 3100_n. The buffer memory 3040 may include volatile memory devices, such as DRAM, SDRAM, DDR SDRAM, LPDDR SDRAM, and GRAM, or nonvolatile memory devices, such as FRAM, ReRAM, STT-MRAM, and PRAM.

Figure 12:
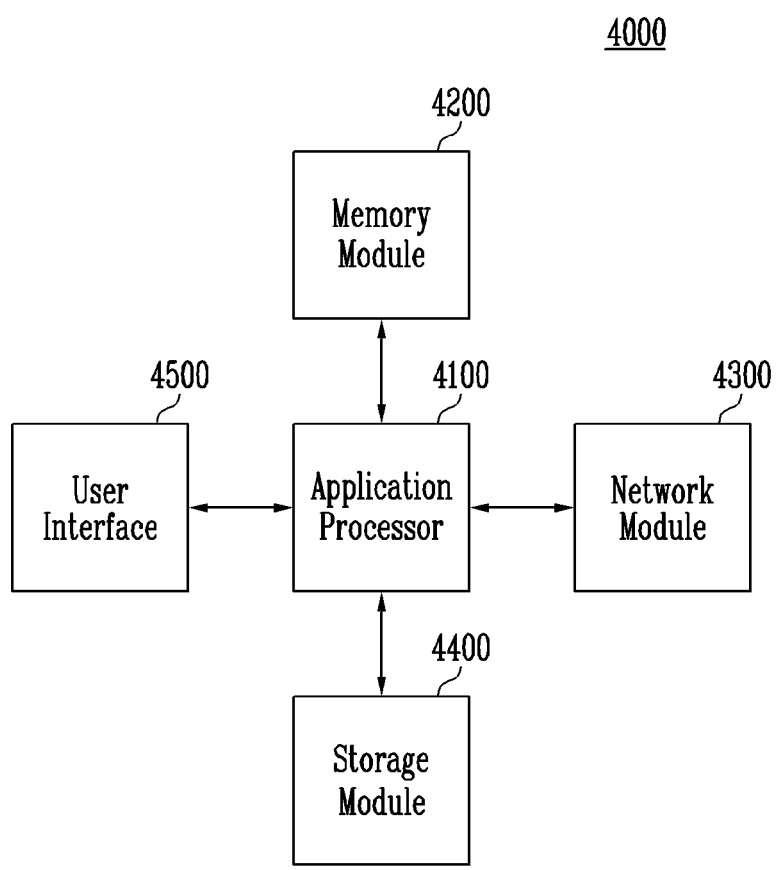
FIG. 12 is a block diagram illustrating a user system to which a memory system according to an embodiment is applied.

FIG. 12 is a block diagram illustrating a user system to which a memory system according to an embodiment is applied.

Referring to FIG. 12, a user system 4000 may include an application processor 4100, a memory module 4200, a network module 4300, a storage module 4400, and a user interface 4500.

The application processor 4100 may run components that are included in the user system 4000, an operating system (OS), or a user program. In an embodiment, the application processor 4100 may include controllers, interfaces, graphic engines, etc. for controlling the components included in the user system 4000. The application processor 4100 may be provided in the form of a system-on-chip (SoC).

The memory module 4200 may function as a main memory, a working memory, a buffer memory or a cache memory of the user system 4000. The memory module 4200 may include volatile RAMs, such as DRAM, SDRAM, DDR SDRAM, DDR2 SDRAM, DDR3 SDRAM, LPDDR SDARM, LPDDR2 SDRAM, and LPDDR3 SDRAM or nonvolatile RAMs such as PRAM, ReRAM, MRAM, and FRAM. In an embodiment, the application processor 4100 and the memory module 4200 may be packaged based on a package-on-package (POP) and may then be provided as a single semiconductor package.

The network module 4300 may communicate with external devices. In an embodiment, the network module 4300 may support wireless communication, such as code division multiple access (CDMA), global system for mobile communication (GSM), wideband CDMA (WCDMA), CDMA-2000, time division multiple access (TDMA), long term evolution (LTE), Wimax, wireless LAN (WLAN), UWB, Bluetooth, or Wi-Fi. In an embodiment, the network module 4300 may be included in the application processor 4100.

The storage module 4400 may store data. For example, the storage module 4400 may store data that is received from the application processor 4100. Alternatively, the storage module 4400 may transmit the data that is stored in the storage module 4400 to the application processor 4100. In an embodiment, the storage module 4400 may be implemented as a nonvolatile semiconductor memory device, such as a phase-change RAM (PRAM), a magnetic RAM (MRAM), a resistive RAM (RRAM), a NAND flash memory, a NOR flash memory, or a NAND flash memory having a 3D structure. In an embodiment, the storage module 4400 may be provided as a removable storage medium (removable drive), such as a memory card or an external drive of the user system 4000.

In an embodiment, the description of the memory system 10, made above with reference to FIG. 1 or the like, may be equally applied to the storage module 4400. For example, the storage module 4400 may include a plurality of nonvolatile memory devices. Here, the description of the memory device 100, made with reference to FIG. 1 or the like, may be equally applied to each of the plurality of nonvolatile memory devices.

The user interface 4500 may include interfaces which input data or instructions to the application processor 4100 or output data to an external device. In an embodiment, the user interface 4500 may include user input interfaces, such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces, such as a liquid crystal display (LCD), an organic light-emitting diode (OLED) display device, an active matrix OLED (AMOLED) display device, an LED, a speaker, and a monitor.

In accordance with embodiments of the present disclosure, there are provided a memory device that is capable of reducing the time required for a read operation, and a method of operating the memory device. Also, the time during which a read voltage reaches a specific level may be shortened.

What is claimed is:

1. A memory device, comprising:
a memory block including a plurality of memory cells that are coupled to a plurality of word lines;
a peripheral circuit configured to perform a read operation by applying a read voltage to a selected word line, among the plurality of word lines, and applying a first pass voltage to target word lines, wherein the target word lines are adjacent to the selected word line, among unselected word lines other than the selected word line; and
a control logic configured to:
decrease the read voltage based on a read voltage variation; and
decrease the first pass voltage based on a pass voltage variation when the read voltage decreases,
wherein the pass voltage variation is less than the read voltage variation.

2. The memory device according to claim 1, wherein the control logic is configured to control the peripheral circuit to apply a second pass voltage to remaining word lines, among the unselected word lines, and maintain a level of the second pass voltage when the read voltage decreases, and
wherein the remaining word lines are word lines other than the target word lines and the selected word line.

3. The memory device according to claim 2, wherein the control logic is configured to control the peripheral circuit to apply, before the read operation is performed, an overcharge voltage to the selected word line, the target word lines, and the remaining word lines.

4. The memory device according to claim 3, wherein the control logic is configured to:
increase a level of the overcharge voltage until the level of the overcharge voltage reaches a reference level, and
when the level of the overcharge voltage reaches the reference level, apply the read voltage having a level that is decreased by a difference between the reference level and the read voltage variation to the selected word line, and apply the first pass voltage having a level that is decreased by a difference between the reference level and the pass voltage variation to the target word lines.

5. The memory device according to claim 1, wherein the control logic comprises:
an operation controller configured to, after states of selected memory cells, among the plurality of memory cells, coupled to the selected word line, are sensed by applying the read voltage having a first voltage level to the selected word line, decrease the read voltage from the first voltage level to a second voltage level based on the read voltage variation, and decrease the first pass voltage based on the pass voltage variation when the read voltage decreases.

6. The memory device according to claim 5, wherein:
the first voltage level is a voltage level that is used to sense a first program state, among a plurality of program states,
the second voltage level is a voltage level that is used to sense a second program state, among the plurality of program states, and
the second program state is lower than the first program state.

7. The memory device according to claim 1, wherein the control logic comprises:
a table storage configured to store voltage information including values of the read voltage variation and values of the pass voltage variation, respectively corresponding to a plurality of reference times.

8. The memory device according to claim 7, wherein the control logic is configured to:
when a first reference time, among the plurality of reference times, is reached, decrease the read voltage based on a first value of the read voltage variation that corresponds to the first reference time, and decrease the first pass voltage based on a first value of the pass voltage variation that corresponds to the first reference time when the read voltage decreases, and
when a second reference time, among the plurality of reference times, which is subsequent to the first reference time, is reached, decrease the read voltage based on a second value of the read voltage variation that corresponds to the second reference time, and decrease the first pass voltage based on a second value of the pass voltage variation that corresponds to the second reference time when the read voltage decreases.

9. The memory device according to claim 8, wherein:
the first value of the pass voltage variation is a value that is obtained by multiplying a first ratio value by the first value of the read voltage variation, and
the second value of the pass voltage variation is a value that is obtained by multiplying a second ratio value by the second value of the read voltage variation.

10. The memory device according to claim 9, wherein the first ratio value is equal to or greater than the second ratio value.

11. The memory device according to claim 9, wherein the first ratio value is less than or equal to the second ratio value.

12. The memory device according to claim 7, wherein the control logic is configured to:
whenever any one of the plurality of reference times is reached, decrease the read voltage based on the value of the read voltage variation that corresponds to the one reference time, and decrease the first pass voltage based on the value of the pass voltage variation that corresponds to the one reference time when the read voltage decreases.

13. A method of operating a memory device, comprising:
applying a read voltage to a selected word line, among a plurality of word lines, coupled to a memory block that is included in the memory device, and applying pass voltages to unselected word lines;
decreasing the read voltage based on a first voltage variation; and
decreasing a pass voltage that is applied to target word lines, among the unselected word lines, adjacent to the selected word line, based on a second voltage variation when the read voltage decreases,
wherein the second voltage variation is less than the first voltage variation.

14. The method according to claim 13, further comprising:
maintaining a level of a pass voltage that is applied to remaining word lines, among the unselected word lines, when the read voltage decreases,
wherein the remaining word lines are word lines other than the target word lines and the selected word line.

15. The method according to claim 14, further comprising:
before the read voltage and the pass voltages are applied, applying an overcharge voltage to the selected word line, the target word lines, and the remaining word lines.

16. The method according to claim 15, wherein applying the read voltage and the pass voltages comprises:
increasing a level of the overcharge voltage until the level of the overcharge voltage reaches a reference level,
when the level of the overcharge voltage reaches the reference level,
applying the read voltage, having a level that is decreased by a difference between the reference level and the first voltage variation, to the selected word line, and
applying the pass voltage, having a level that is decreased by a difference between the reference level and the second voltage variation, to the target word lines.

17. The method according to claim 13, further comprising:
sensing states of selected memory cells, among the plurality of memory cells that are included in the memory block, coupled to the selected word line, by applying the read voltage having a first voltage level to the selected word line,
wherein decreasing the read voltage comprises, decreasing the read voltage from the first voltage level to a second voltage level based on the first voltage variation after the states of the selected memory cells are sensed.

18. The method according to claim 17, wherein:
the first voltage level is a voltage level that is used to sense a first program state, among a plurality of program states,
the second voltage level is a voltage level that is used to sense a second program state, among the plurality of program states, and
the second program state is lower than the first program state.

19. The method according to claim 13, further comprising:
determining a value, obtained by multiplying a ratio value that is less than 1 by the first voltage variation, to be the second voltage variation.

20. The method according to claim 13, further comprising:
when a reference time has elapsed from a time point at which the read voltage decreased,
decreasing the read voltage based on the first voltage variation, and
decreasing the pass voltage that is applied to the target word line based on the second voltage variation.

* * * * *